US010590306B2

(12) United States Patent
Ashibe et al.

(10) Patent No.: US 10,590,306 B2
(45) Date of Patent: Mar. 17, 2020

(54) RESIN COMPOSITION FOR DISPLAY SUBSTRATE, AND HEAT-RESISTANT RESIN FILM, ORGANIC EL DISPLAY SUBSTRATE, AND METHOD FOR MANUFACTURING ORGANIC EL DISPLAY USING SAME

(71) Applicant: TORAY INDUSTRIES, INC., Tokyo (JP)

(72) Inventors: Tomoki Ashibe, Otsu (JP); Daichi Miyazaki, Otsu (JP); Koji Ueoka, Otsu (JP); Akinori Saeki, Otsu (JP); Masahito Nishiyama, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/768,917

(22) PCT Filed: Sep. 30, 2016

(86) PCT No.: PCT/JP2016/079059
§ 371 (c)(1),
(2) Date: Apr. 17, 2018

(87) PCT Pub. No.: WO2017/068936
PCT Pub. Date: Apr. 27, 2017

(65) Prior Publication Data
US 2019/0055428 A1    Feb. 21, 2019

(30) Foreign Application Priority Data

Oct. 23, 2015  (JP) .................................. 2015-208611
Feb. 24, 2016  (JP) .................................. 2016-032704
Mar. 2, 2016   (JP) .................................. 2016-039630

(51) Int. Cl.
*C09D 179/08*    (2006.01)
*C08G 73/10*     (2006.01)
(Continued)

(52) U.S. Cl.
CPC ......... *C09D 179/08* (2013.01); *C08G 73/106* (2013.01); *C08G 73/1039* (2013.01);
(Continued)

(58) Field of Classification Search
None
See application file for complete search history.

(56) References Cited

U.S. PATENT DOCUMENTS 6,099,939 A * 8/2000 Mittal .................... C23C 14/024
257/E21.576
2007/0222368 A1* 9/2007 Lee ...................... H01L 27/3244
313/503
(Continued)

FOREIGN PATENT DOCUMENTS

JP    2005246716 A    9/2005
JP    2013040249 A    2/2013
(Continued)

OTHER PUBLICATIONS

International Search Report and Written Opinion for International Application No. PCT/JP2016/079059, dated Nov. 1, 2016—7 pages.

*Primary Examiner* — Bo B Jang
(74) *Attorney, Agent, or Firm* — RatnerPrestia

(57) ABSTRACT

A resin composition for a display substrate, the resin composition including a solvent and a heat-resistant resin or a precursor thereof, wherein the solvent has as a main component an amide compound having a surface tension of 35 mN/m or less at 25° C. Provided is a resin composition for a display substrate, whereby pinholing of a thin film is not prone to occur.

7 Claims, 3 Drawing Sheets

(51) Int. Cl.
  *C09D 7/63* (2018.01)
  *H01L 51/56* (2006.01)
  *H01L 51/52* (2006.01)
  *C08L 79/08* (2006.01)
  *C08L 101/00* (2006.01)
  *H01L 51/00* (2006.01)
  *C09D 5/18* (2006.01)
  *C09D 7/65* (2018.01)
  *C09D 7/20* (2018.01)
  *C08K 5/544* (2006.01)

(52) U.S. Cl.
  CPC ..... *C08G 73/1042* (2013.01); *C08G 73/1067* (2013.01); *C08G 73/1071* (2013.01); *C08G 73/1082* (2013.01); *C08L 79/08* (2013.01); *C08L 101/00* (2013.01); *C09D 5/18* (2013.01); *C09D 7/63* (2018.01); *H01L 51/0097* (2013.01); *H01L 51/56* (2013.01); *C08K 5/544* (2013.01); *C09D 7/20* (2018.01); *C09D 7/65* (2018.01); *H01L 51/5253* (2013.01); *H01L 2251/301* (2013.01)

(56) References Cited

U.S. PATENT DOCUMENTS

2015/0232619 A1  8/2015  Shida et al.
2017/0137571 A1  5/2017  Nakayama et al.

FOREIGN PATENT DOCUMENTS

| | | |
|---|---|---|
| JP | 2015151515 A | 8/2015 |
| WO | 2013125194 A1 | 8/2013 |
| WO | 2013133168 A1 | 9/2013 |
| WO | 2015186782 A1 | 12/2015 |

* cited by examiner

A

RESIN COMPOSITION FOR DISPLAY SUBSTRATE, AND HEAT-RESISTANT RESIN FILM, ORGANIC EL DISPLAY SUBSTRATE, AND METHOD FOR MANUFACTURING ORGANIC EL DISPLAY USING SAME

CROSS REFERENCE TO RELATED APPLICATIONS

This is the U.S. National Phase application of PCT/JP2016/079059, filed Sep. 30, 2016, which claims priority to Japanese Patent Application No. 2015-208611, filed Oct. 23, 2015, Japanese Patent Application No. 2016-032704, filed Feb. 24, 2016, and Japanese Patent Application No. 2016-039630, filed Mar. 2, 2016, the disclosures of these applications being incorporated herein by reference in their entireties for all purposes.

TECHNICAL FIELD OF THE INVENTION

The present invention relates to a resin composition for a display substrate, and method for manufacturing a heat resistant resin film, an organic EL display substrate, and organic EL displays using same.

BACKGROUND OF THE INVENTION

Heat resistant resins such as polyimide, polybenzoxazole, polybenzothiazole, and polybenzimidazole have been used as materials for various electronic devices such as semiconductors and display devices because of their good electrical insulation properties, heat resistance, and mechanical properties. Recently, production of shock resistant, flexible image display devices have become possible by applying heat resistant resin film to the substrates of image display devices such as organic EL displays, electronic paper, and color filters.

To apply a heat resistant resin as material for a display substrate, a common method is to spread a solution containing a heat resistant resin or a precursor thereof (hereinafter referred to as varnish) over a support, followed by firing the coating to form a film. An effort that uses N-methylpyrrolidone, which is high in ability to dissolve resins, as a solvent for resin compositions for display substrates has been reported (Patent document 1).

If a heat resistant resin film is used as display substrate, there will occur a problem associated with the poor barrier properties of the resin film, leading to easy infiltration of moisture and oxygen into the display internal. In organic EL displays, in particular, the light emitting devices can be deactivated easily due to infiltration of moisture, so the display substrates require good barrier properties. As a solution to solve this problem, a display substrate with good barrier properties having a plurality of layers of resin film and inorganic film has been reported (Patent document 2).

PATENT DOCUMENTS

Patent document 1: Japanese Unexamined Patent Publication (Kokai) No. 2013-40249
Patent document 2: Japanese Unexamined Patent Publication (Kokai) No. 2005-246716

SUMMARY OF THE INVENTION

For the resin composition described in Patent document 1, films produced by coating a support and drying may have a problem of pinhole formation. The laminate of resin film and inorganic film described in Patent document 2 has the problem of significant pinhole generation if produced by coating inorganic film with the resin composition. An organic EL display produced by using a display substrate formed as described above can have the problem of infiltration of moisture or the like through pinholes into the display device to cause pixel defects, leading to a low yield of display production.

The present invention provides a resin composition for display substrate production including a heat resistant resin or a precursor thereof and a solvent, the solvent containing, as primary component, an amide compound with a surface tension of 35 mN/m or less at 25° C.

The present invention can provide a resin composition for a display substrate that suffers from little pinhole generation in the coating film. It also provides a high yield method for organic EL display substrate production that includes a step of coating an inorganic film while ensuring little pinhole generation.

DETAILED DESCRIPTION OF EMBODIMENTS OF THE INVENTION

Figure 1:
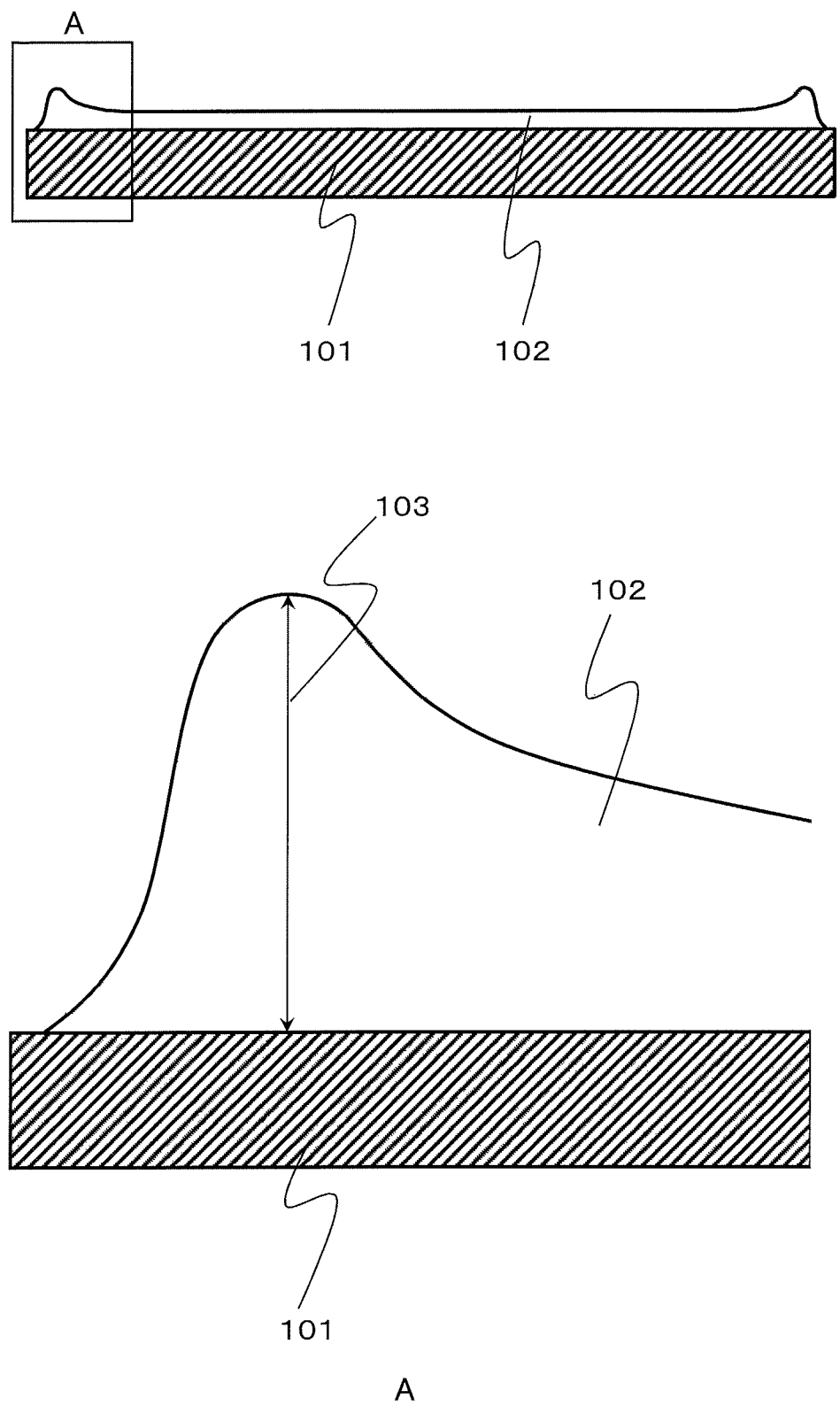
FIG. 1 is a cross section of a laminate produced by forming a heat resistant resin film on a glass substrate.

The present invention provides a resin composition for a display substrate including a heat resistant resin or a precursor thereof and a solvent, the solvent containing, as primary component, an amide compound with a surface tension of 35 mN/m or less at 25° C.

(Solvent)

The present invention uses a solvent containing, as primary component, an amide compound with a surface tension of 35 mN/m or less at 25° C. The primary component referred to herein is the compound that accounts for 50 mass % or more of the solvent. An amide compound with a surface tension of 35 mN/m or less allows the resin-containing solution to have a decreased surface tension to reduce the pinhole generation in the coating film.

The surface tension of the solvent at 25° C. is more preferably 33 mN/m or less and still more preferably 31 mN/m or less. The surface tension is also preferably 25 mN/m or more, more preferably 27 mN/m or more, and still more preferably 29 mN/m or more. A value of 25 mN/m or more serves to prevent the resin composition from flowing at the edge of the coating film causing the expansion of the coating region when coating a support with it.

Examples of such an amide compound with a surface tension of 35 mN/m or less at 25° C. include N,N-dimethyl propione amide (surface tension 33.5 mN/m), N,N-diethyl acetamide (surface tension 31.6 mN/m), N,N-dimethyl isobutyl amide (surface tension 31.0 mN/m), and N,N-diethyl propione amide (surface tension 25.0 mN/m).

Of these, N,N-dimethyl isobutyl amide is the most preferable from the viewpoint of the solubility of the heat resistant resin or the precursor thereof and the drying property.

For the present invention, the ring method is used to measure the surface tension of a solvent. More specifically, it is measured using a du Nouey surface tensiometer by the procedure as specified in JIS K 2241 (2000).

It is preferable for the amide compound with a surface tension of 35 mN/m or less at 25° C. to account for 50 mass % or more, more preferably 80 mass % or more, and still more preferably 90 mass % or more, of the total quantity of the solvent contained in the resin composition used for the present invention.

For the present invention, a solvent other than the amide compound with a surface tension of 35 mN/m or less at 25° C. may also be used in combination as long as a required coatability is maintained. Examples include amides such as N-methyl-2-pyrolidone (surface tension 40.9 mN/m), N,N-dimethyl formamide (surface tension 39.7 mN/m), N,N-dimethyl acetamide (surface tension 35.6 mN/m), and 3-methoxy-N,N-dimethyl propione amide (surface tension 36.3 mN/m); esters such as γ-butyrolactone, ethyl acetate, propylene glycol monomethyl ether acetate, and ethyl lactate; urea compounds such as 1,3-dimethyl-2-imidazolidinone, N,N'-dimethyl propylene urea, and 1,1,3,3-tetramethyl urea; sulfoxides such as dimethyl sulfoxide and tetramethylenesulfoxide; sulfones such as dimethyl sulfone and sulfolane; ketones such as acetone, methyl ethyl ketone, diisobutyl ketone, diacetone alcohol, and cyclohexanone; ethers such as tetrahydrofuran, dioxane, propylene glycol monomethyl ether, propylene glycol monoethyl ether, diethylene glycol monomethyl ether, diethylene glycol monoethyl ether, diethylene glycol ethylmethyl ether, and diethylene glycol dimethyl ether; aromatic hydrocarbons such as toluene and xylene; alcohols such as methanol, ethanol, and isopropanol; and water; which may be used singly or as a combination of two or more thereof.

In the resin composition according to the present invention, the solvent preferably accounts for 60 mass % or more, more preferably 70 mass % or more, relative to 100 mass % of the resin composition. It is also preferably 97 mass % or less, more preferably 95 mass % or less. A solvent content of 60 mass % or more ensures thorough dissolution of the heat resistant resin or precursor thereof to permit easy formation of a uniform film, whereas a solvent content of 97 mass % or less ensures easy formation of thick film.

(Silane Compound)

The resin composition according to the present invention preferably contains a silane compound, which works to prevent the coating film from undergoing partial lifting from the support (hereinafter referred to as film lifting) in the calcination step that follows the coating of the support. For effect prevention of film lifting during calcination, it is necessary for the silane compound to have a boiling point of 250° C. or more, preferably 255° C. or more. If it is less than 250° C., the silane compound will volatilize before film lifting occurs in the film calcination step, failing to work effectively for prevention of film lifting.

There are no specific limitations on the upper limit of the boiling point. If remaining in the film after the calcination step because of, for example, a boiling point higher than that of the calcination temperature, the compound will have no influence on the film lifting prevention effect.

It is preferable for the silane compound to contain at least one selected from the following: vinyl group, epoxy group, styryl group, methacryl group, acrylic group, amino group, ureido group, mercapto group, sulfide group, and isocyanate group. If containing these functional groups, the silane compound will work effectively for prevention of film lifting as a result of interaction with the heat resistant resin or precursor thereof.

It is preferable for the silane compound to further contain a compound having a structure as represented by chemical formula (1).

[Chemical compound 1]

(1)

$R^1$ to $R^3$ in chemical formula (1) each independently represent a hydrogen atom, hydroxy group, alkyl group, or alkoxy group. A is a hydrocarbon group that may contain at least one selected from the following: ether groups, carbonyl groups, and ester groups. B is a vinyl group, epoxy group, styryl group, methacryl group, acrylic group, amino group, ureido group, mercapto group, sulfide group, isocyanate group, or hydrocarbon group that contains at least one selected therefrom. Here, p and q each independently being an integer of 1 to 100.

Preferable examples of A include aliphatic hydrocarbon groups containing 1 to 6 carbon atoms, aromatic hydrocarbon groups containing 6 to 10 carbon atoms, and ether groups containing 1 to 6 carbon atoms.

It is preferable for B to contain at least one selected from epoxy group, amino group, and ureido group, and it is particularly preferable to contain a ureido group having a structure as represented by chemical formula (2).

[Chemical compound 2]

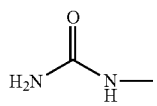

(2)

If having such a structure, B serves to ensure a strong interaction with the heat resistant resin or precursor thereof, leading to more effective prevention of film lifting.

Examples of the silane compound include silane coupling agents such as 2-(3,4-epoxy cyclohexyl) ethyl trimethoxysilane, 3-glycidoxypropyl methyl dimethoxy silane, 3-glycidoxypropyl trimethoxysilane, 3-glycidoxypropyl methyl diethoxy silane, 3-glycidoxypropyl triethoxysilane, p-styryl trimethoxysilane, 3-methacryloxypropyl trimethoxysilane, 3-methacryloxypropyl methyl diethoxy silane, 3-methacryloxypropyl triethoxysilane, N-2-(aminoethyl)-3-aminopropyl trimethoxysilane, N-phenyl-3-aminopropyl trimethoxysilane, tris-(trimethoxy silylpropyl) isocyanurate, 3-ureidopropyl triethoxysilane, 3-ureidopropyl trimethoxysilane, 3-ureidopropyl methoxydiethoxy silane, 3-ureidopropyl dimethoxyethoxysilane, 3-isocyanate propyl triethoxysilane, and 3-trimethoxysilyl propylsuccinic anhydride. They may also contain a siloxane oligomer having a functional group such as alkoxy group, amino group, epoxy group, and ureido group, or contain an organic polymer having a functional group such as alkoxysilyl group, amino group, epoxy group, and ureido group. Or they may include an alkoxysilane-containing aromatic amine compound or an alkoxysilane-containing aromatic amide compound as shown below.

[Chemical compound 3]

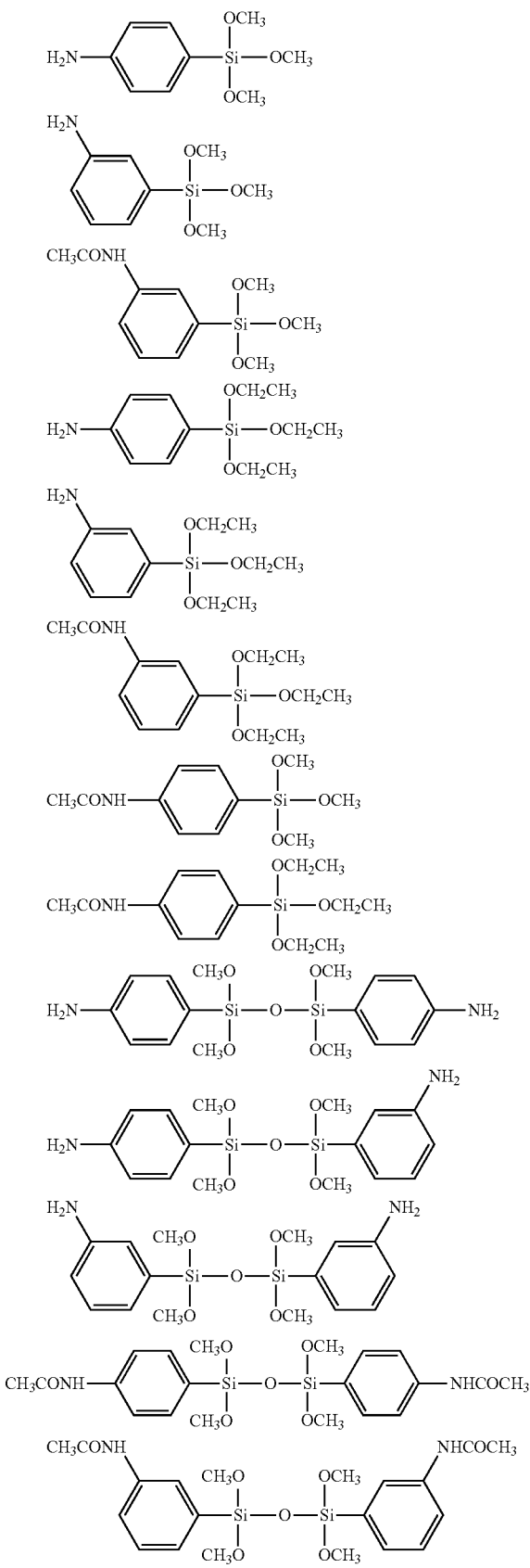

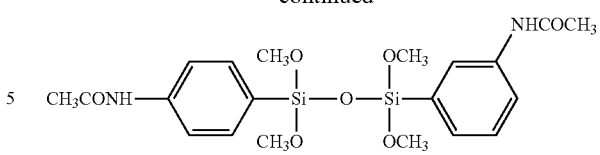

Besides, compounds produced through a reaction between an aromatic amine compound and an alkoxy-containing silicon compound can also be used. Such compounds include, for example, those produced by reacting an aromatic amine compound with an alkoxysilane compound having a group reactive with an amino group such as epoxy group and chloromethyl group.

The silane compound preferably accounts for 0.005 parts by mass or more, more preferably 0.01 parts by mass or more, relative to 100 parts by mass of the heat resistant resin or precursor thereof. The proportion is also preferably 4 parts by mass or less, more preferably 2 parts by mass or less. Film lifting is prevented more effectively if the quantity of the silane compound is 0.005 parts by mass or more whereas calcined film can be peeled from the support more easily if it is 4 parts by mass or less.

(Heat Resistant Resin or Precursor Thereof)

For the present invention, a heat resistant resin means one that does not have a melting point or a decomposition temperature at temperatures less than 300° C., and examples include polyimide, polybenzoxazole, polybenzothiazole, polybenzimidazole, polyamide, polyethersulfone, and polyether ether ketone. Among others, preferable heat resistant resins to be used for the present invention include polyimide and polybenzoxazole, of which polyimide is more preferable. If polyimide is adopted as heat resistant resin, film of the heat resistant resin used for display substrate production will have good heat resistance properties (including outgassing characteristics and glass transition temperature) at temperatures in the production process and also have good mechanical characteristics suitable to provide displays with toughness after the production step.

A precursor of heat resistant resin is a resin that can be converted into a heat resistant resin as described above by heat treatment, chemical treatment, or the like. For the present invention, preferable examples of such a heat resistant resin precursor are polyimide precursor and polybenzoxazole precursor. More specifically, polyamic acid and polyhydroxyamide are preferable, of which polyamic acid is more preferable.

Polyamic acid is a resin having a structure as represented by chemical formula (3) whereas polyimide is a resin having a structure as represented by chemical formula (4),

[Chemical compound 4]

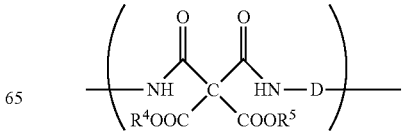

(3)

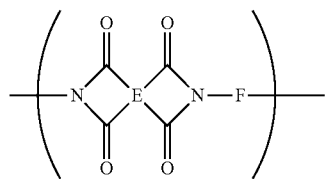

(4)

In chemical formulae (3) and (4), C and E each denote a tetravalent tetracarboxylic acid residue containing 2 or more carbon atoms and D and F each denote a divalent diamine residue containing 2 or more carbon atoms. In chemical formula (3), $R^4$ and $R^5$ each denote a hydrogen atom, alkali metal ion, ammonium ion, imidazolium ion, hydrocarbon group containing 1 to 10 carbon atoms, or alkyl silyl group containing 1 to 10 carbon atoms.

Polyamic acid in a solution thereof undergoes hydrolysis as it reacts with water existing in the solution. As a result, the solution containing polyamic acid changes in viscosity with time. When slit coating is performed, the coatability changes with the viscosity, making it necessary to readjust the slit coating apparatus.

Furthermore, the carboxy group and the amide group in polyamic acid are functional groups with high polarity. These functional groups are in a stable energy state owing to the intermolecular forces working among solvent molecules in the solution. If polyamic acid exists near the surface of the solution, on the other hand, these functional groups will be exposed to the atmosphere, leading to an unstable state. Specifically, dissolution of polyamic acid in a solvent causes negative absorption, leading to an increase in surface tension of the solution.

In general, as a coating film is dried, the drying speed at the edge is higher than that in the interior of the film, and accordingly, the solid concentration at the edge is always higher than that in the interior of the film. Thus, it has been elucidated by investigations of the present inventors that as a coating film of a solution containing polyamic acid is dried, the surface tension at the edge becomes higher than that in the interior in the course of the process, leading to a distorted shape of the edge after drying.

If the polyamic acid is imidized or esterified, hydrolysis will not occur and the numbers of carboxy groups and amide groups will decrease, serving to avoid the above problem. With a few exceptions, however, imidization of polyamic acid or complete esterification of polyamic acid will cause a decrease in solubility in the solvent. Therefore, an increase in the solid concentration of the solution occurring in the course of the drying of the coating film will cause a rapid decrease in the flowability of the solution. Accordingly, the surface of the coating film dries fast while the interior is slow in drying to cause shrinkage, and the thickness uniformity in the film's interior region will deteriorate easily, leading to irregularities in orange peel finish.

To avoid the above problem, the resin composition according to the present invention preferably includes a solvent containing, as primary component, an amide compound with a surface tension of 35 mN/m or less at 25° C., together with either (Resin 1) or (Resin 2) as components of the resin composition. Specifically, it is preferable to include either (Resin 1) which is a resin containing polyamic acid as primary component, with an imide structure being contained in part of the resin, or (Resin 2) which is a resin containing polyamic acid as primary component, with 50 to 95 mol % of the carboxy groups in the polyamic acid being esterified.

The primary component referred to herein is one that accounts for 50 mol % or more of all repeating units contained in the resin. This means that (Resin 1) is a resin wherein 50 mol % or more of the repeating units are represented by chemical formula (3); the repeating units represented by chemical formula (3) and those by chemical formula (4) are contained at a molar ratio of 95:5 to 75:25; and $R^4$ and $R^5$ in chemical formula (3) are each a hydrogen atom. In (Resin 2), on the other hand, 50 mol % or more of the repeating units are represented by chemical formula (3), and 50 to 95 mol % of the groups represented by $R^4$ or $R^5$ in chemical formula (3) are hydrocarbon groups containing 1 to 10 carbon atoms.

First, (Resin 1) is described below.

Polyamic acid is produced through reaction between a tetracarboxylic acid and a diamine compound, as described later. Polyamic acid can be converted into polyimide by heat or chemical treatment. Accordingly, (Resin 1) can be said to be a product of partial imidization of polyamic acid.

(Resin 1) contains repeating units as represented by chemical formula (3) and those by chemical formula (4) at a molar ratio [chemical formula (3):chemical formula (4)] of 95:5 to 75:25. This suggests that (Resin 1) is a resin resulting from imidization of 5 to 25 mol % of the repeating units in all polyamic acid molecules in the resin.

Coating film will have a good edge shape if the proportion of the repeating units represented by chemical formula (3) is not above the upper limit. In addition, (Resin 1) will have high solubility and dried coat film will have high thickness uniformity if the proportion of the repeating units represented by chemical formula (3) is not below the lower limit.

From the viewpoint of the shape of the edge of coating film, it preferably contains repeating units as represented by chemical formula (3) and those by chemical formula (4) at a molar ratio [chemical formula (3):chemical formula (4)] of 90:10 to 75:25, more preferably at a molar ratio of 87:13 to 75:25. From the viewpoint of the solubility of (Resin 1), the molar ratio is more preferably 95:5 to 80:20, still more preferably 95:5 to 83:17.

Other preferable ranges may be found by appropriately combining the upper and lower limit values given above. Thus, it is also preferable, for example, that repeating units as represented by chemical formula (3) and those by chemical formula (4) be contained at a molar ratio of 90:10 to 83:17.

The molar ratio between the repeating units represented by chemical formula (3) and those by chemical formula (4) contained in components of a resin composition can be determined by analyzing the $^1$H-NMR spectrum of the components of the resin composition. A procedure is described in detail below.

First, $^1$H-NMR spectra of the relevant components of the resin composition are observed.

Next, the peak integral (denoted as a) is determined for all 1H atoms or other specific $^1$H atoms contained in C, D, E, and F in chemical formulae (3) and (4).

Subsequently, assuming that the molar ratio between the repeating units represented by chemical formula (3) and those by chemical formula (4) contained in the relevant components of a resin composition is 100:0, the peak integral (denoted as β) associated with the $^1$H atoms in the amide groups in chemical formula (3) is estimated from the integral value obtained above (this means the calculation of the integral value of the $^1$H peak of the amide group on the assumption that the resin is in the non-imidized, completely polyamic acid state). Specifically, it can be calculated by the following equation.

$$\beta = \alpha/\omega \times 2$$

Here, ω is the number of the hydrogen atoms included in the calculation of α.

Finally, the peak integral (denoted as ε) associated with the $^1$H atoms in the amide groups is determined from actual measurements, and the molar ratio is calculated by the following equation.

Molar ratio=ε:β−ε

Here, the specimen used for $^1$H-NMR observation preferably contains only one resin component of the resin composition, but it may contain other components of the resin composition. It is preferable, however, that the peaks of the $^1$H atoms contained in the other components of the resin composition do not overlap the peak of the $^1$H atoms serving as marker for calculating the molar ratio.

When the components of the resin composition includes (Resin 1), it is preferable for the repeating units represented by chemical formula (3) to account for 50 mol % or more of all repeating units contained in the resin composition component. It is more preferably 60 mol % or more, and still more preferably 70 mol % or more.

Next, (Resin 2) is described below.

Polyamic acid and polyamic acid esters can be produced through reaction between a tetracarboxylic acid and a diamine compound, as described later. Polyamic acid and polyamic acid esters can be converted into polyimides by heat or chemical treatment.

If the hydrocarbon groups containing 1 to 10 carbon atoms account for 50 mol % or more of the $R^4$ and $R^5$ groups in (Resin 2), it ensures the formation of coating film with a good edge shape. If the proportion is 95 mol % or less, (Resin 2) will be high in solubility, and the resulting dried coat film will be high in film thickness uniformity.

Furthermore, it is more preferable that the hydrocarbon groups containing 1 to 10 carbon atoms account for 60 mol % or more, still more preferably 70 mol % or more, of the $R^4$ and $R^5$ groups in (Resin 2). On the other hand, the proportion is more preferably 90 mol % or less, still more preferably 85 mol % or less.

Other preferable ranges may be found by appropriately combining the upper and lower limit values given above. Thus, the proportion is also preferably in the range of 80 to 85 mol %.

Preferable examples of such hydrocarbon groups containing 1 to 10 carbon atoms include aliphatic hydrocarbon groups, which may be straight, branched, or cyclic. Such hydrocarbon groups include, for example, straight-chain hydrocarbon groups such as ethyl group, n-propyl group, n-butyl group, n-pentyl group, n-hexyl group, n-heptyl group, n-octyl group, n-nonyl group, and n-decyl group; branched chain hydrocarbon groups such as isopropyl group, isobutyl group, sec-butyl group, tert-butyl group, isopentyl group, sec-pentyl group, tert-pentyl group, isohexyl group, and sec-hexyl group; and cyclic hydrocarbon groups such as cyclopropyl group, cyclobutyl group, cyclopentyl group, cyclohexyl group, cycloheptyl group, cyclooctyl group, norbornyl group, and adamantly group.

The proportion (mole fraction) of the hydrocarbon groups containing 1 to 10 carbon atoms to the total of $R^4$ and $R^5$ groups in a component of the resin composition can be determined from $^1$H-NMR spectrum observation of the component of the resin composition. A procedure is described in detail below.

First, $^1$H-NMR spectra of the relevant components of the resin composition are observed.

Next, the peak integral (denoted as ζ) is measured for all $^1$H atoms or other specific $^1$H atoms contained in C and D in chemical formula (3).

Subsequently, assuming that all (100 mol %) of the $R^4$ and $R^5$ groups in the components of the resin composition are hydrocarbon groups (that is, in the case where the carboxy groups in the resin are completely esterified), the peak integral (denoted as q) for all the $^1$H atoms or the specific $^1$H atoms in the hydrocarbon groups is determined from the integral value obtained above. Specifically, it can be calculated by the following equation.

η=(ζ/θ)×ψ

Here, θ is the number of the hydrogen atoms included in the calculation of ζ. Of the hydrogen atoms contained in the above hydrocarbon groups, the number of the hydrogen atoms included in the calculation of ζ is represented as ψ above.

Finally, the peak integral (denoted as μ) associated with the $^1$H atoms in the hydrocarbon groups is determined from actual measurements, and the mole fraction is calculated by the following equation.

Mole fraction (%)=(μ/η)×100

Here, the specimen used for $^1$H-NMR observation preferably contains only one resin component of the resin composition, but it may contain other components of the resin composition. It is preferable, however, that the peaks of the $^1$H atoms contained in the other components of the resin composition do not overlap the peak of the $^1$H atoms serving as marker for calculating the mole fraction.

When the components of the resin composition includes (Resin 2), it is preferable for the repeating units represented by chemical formula (3) to account for 50 mol % or more of all repeating units contained in the resin composition component. It is more preferably 60 mol % or more, and still more preferably 70 mol % or more.

It is preferable for C and E in chemical formula (3) and (4) to be tetravalent hydrocarbon groups each containing 2 to 80 carbon atoms. C and E, furthermore, may be each an tetravalent organic group containing 2 to 80 carbon atoms and including hydrogen and carbon as essential elements and one or more atoms selected from the group of boron, oxygen, sulfur, nitrogen, phosphorus, silicon, and halogens. For each of boron, oxygen, sulfur, nitrogen, phosphorus, silicon, and halogens, the number of atoms included is preferably in the range of 20 or less, more preferably in the range of 10 or less.

Examples of tetracarboxylic acid that can give C or E include the following.

Examples of such aromatic tetracarboxylic acid include monocyclic aromatic tetracarboxylic acid compounds such as pyromellitic acid and 2,3,5,6-pyridine tetracarboxylic acid; various isomers of biphenyl tetracarboxylic acid such as 3,3',4,4'-biphenyl tetracarboxylic acid, 2,3,3',4'-biphenyl tetracarboxylic acid, 2,2',3,3'-biphenyl tetracarboxylic acid, 3,3',4,4'-benzophenone tetracarboxylic acid, and 2,2',3,3'-benzophenone tetracarboxylic acid; bis(dicarboxyphenyl) compounds such as 2,2-bis(3,4-dicarboxyphenyl) hexafluoropropane, 2,2-bis(2,3-dicarboxyphenyl) hexafluoropropane, 2,2-bis(3,4-dicarboxyphenyl) propane, 2,2-bis(2,3-dicarboxyphenyl) propane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) sulfone, and bis(3,4-dicarboxyphenyl) ether; bis(dicarboxyphenoxyphenyl) compounds such as 2,2-bis[4-(3,4-dicarboxyphenoxy) phenyl] hexafluoropropane, 2,2-bis[4-(2,3-dicarboxyphenoxy) phenyl] hexafluoropropane, 2,2-bis[4-(3,4-dicarboxyphenoxy) phenyl] propane, 2,2-bis[4-(2,3-dicarboxyphenoxy) phenyl] propane, 2,2-bis[4-(3,4-dicarboxyphenoxy) phenyl]sulfone, and 2,2-bis[4-(3,4-dicarboxyphenoxy) phenyl] ether; various isomers of naphthalene or fused polycyclic aromatic tetracarboxylic acid such as 1,2,5,6-naphthalene tetracarboxylic acid, 1,4,5,8-naphthalene tetracarboxylic acid, 2,3,6,7-naphthalene tetracarboxylic acid, 2,3,6,7-naphthalene tetracarboxylic acid, and 3,4,9,10-perylene tetracarboxylic acid; and bis(trimellitic acid monoester acid anhydride) compounds such as p-phenylene bis(trimellitic acid monoester acid anhydride), p-biphenylene bis(trimellitic acid monoester acid anhydride), ethylene bis(trimellitic acid monoester acid anhydride), and bisphenol A bis(trimellitic acid monoester acid anhydride).

Examples of such aliphatic tetracarboxylic acid include linear aliphatic tetracarboxylic acid compounds such as butane tetracarboxylic acid; and alicyclic tetracarboxylic acid compounds such as cyclobutane tetracarboxylic acid, 1,2,3,4-cyclopentane tetracarboxylic acid, 1,2,4,5-cyclohexane tetracarboxylic acid, bicyclo[2.2.1.]heptane tetracarboxylic acid, bicyclo[3.3.1.]tetracarboxylic acid, bicyclo[3.1.1.]hept-2-ene tetracarboxylic acid, bicyclo[2.2.2.]octane tetracarboxylic acid, and adamantane tetracarboxylic acid.

These tetracarboxylic acids may be used in their original form or in the form of acid anhydride, active ester, or active amide. Two or more thereof may be used in combination.

From the viewpoint of prevention of film lifting, it is preferable that 50 mol % or more of the total quantity of tetracarboxylic acids be accounted for by aromatic tetracarboxylic acids, as described later. In particular, it is preferable that a tetravalent tetracarboxylic acid residue as represented by chemical formula (5) or (6) be the primary component in C and E.

[Chemical compound 5]

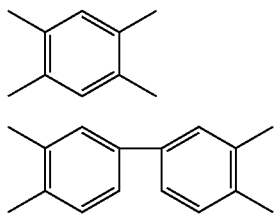

(5)

(6)

More specifically, it is preferable to adopt pyromellitic acid or 3,3',4,4'-biphenyl tetracarboxylic acid as primary component. For the present invention, the term "primary component" above refers to one that accounts for 50 mol % or more of the total quantity of tetracarboxylic acids. It is more preferable for the proportion to be 80 mol % or more. Those polyimides produced from these tetracarboxylic acids form film with a small coefficient of thermal linear expansion and ensure a small stress and little film lifting during film formation on a substrate.

A silicon-containing tetracarboxylic acid such as dimethylsilane diphthalic acid and 1,3-bis(phthalic acid)tetramethyl disiloxane may be adopted with the aim of increasing the coatability on a support and the resistance to oxygen plasma used for cleaning and the like and to UV ozone processing. It is preferable that these silicon-containing tetracarboxylic acids account for 1 to 30 mol % of the total quantity of tetracarboxylic acids.

For the tetracarboxylic acids given above as examples, one or more of the hydrogen atoms contained in a tetracarboxylic acid residue may be each replaced with a hydrocarbon group containing 1 to 10 carbon atoms such as methyl group and ethyl group; a fluoroalkyl group containing 1 to 10 carbon atoms such as trifluoromethyl group; or other groups such as F, Cl, Br, and I. Being able to serving for improving the solubility of the heat resistant resin or precursor thereof in an aqueous alkali solution, furthermore, substitution of acidic groups such as OH, COOH, $SO_3H$, $CONH_2$, and $SO_2NH_2$ is preferable when preparing a photosensitive resin composition as described later.

It is preferable for D and F in chemical formula (3) and (4) to be divalent hydrocarbon groups each containing 2 to 80 carbon atoms. D and F, furthermore, may be each a divalent organic group containing 2 to 80 carbon atoms and including hydrogen and carbon as essential elements and one or more atoms selected from the group of boron, oxygen, sulfur, nitrogen, phosphorus, silicon, and halogens. For each of boron, oxygen, sulfur, nitrogen, phosphorus, silicon, and halogens, the number of atoms included is preferably in the range of 20 or less, more preferably in the range of 10 or less.

Examples of diamine that can give D or F include the following.

Examples of diamine compounds containing aromatic rings include monocyclic aromatic diamine compounds such as m-phenylene diamine, p-phenylene diamine, and 3,5-diaminobenzoic acid; naphthalene or fused polycyclic aromatic diamine compounds such as 1,5-naphthalene diamine, 2,6-naphthalene diamine, 9,10-anthracene diamine, and 2,7-diaminofluorene; bis(diaminophenyl) compounds and various derivatives thereof such as 4,4'-diaminobenzanilide, 3,4'-diaminodiphenyl ether, 4,4'-diaminodiphenyl ether, 3-carboxy-4,4'-diaminodiphenyl ether, 3-sulfonic acid-4,4'-diaminodiphenyl ether, 3,4'-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, 4-aminobenzoic acid-4-aminophenyl ester, 9,9-bis(4-aminophenyl) fluorine, and 1,3-bis(4-anilino)tetramethyl disiloxane; 4,4'-diaminobiphenyl and various derivatives thereof such as 4,4'-diaminobiphenyl, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-di(trifluoromethyl)-4,4'-diaminobiphenyl; bis (aminophenoxy) compounds such as bis(4-aminophenoxy phenyl) sulfone, bis(3-aminophenoxy phenyl) sulfone, bis (4-aminophenoxy) biphenyl, bis[4-(4-aminophenoxy) phenyl] ether, 2,2-bis[4-(4-aminophenoxy) phenyl] propane, 2,2-bis[4-(4-aminophenoxy) phenyl] hexafluoropropane, 1,4-bis(4-aminophenoxy) benzene, 1,3-bis(3-aminophenoxy) benzene, and 1,3-bis(4-aminophenoxy) benzene; bis (3-amino-4-hydroxyphenyl) compounds such as bis(3-amino-4-hydroxyphenyl) hexafluoropropane, bis(3-amino-4-hydroxyphenyl) sulfone, bis(3-amino-4-hydroxyphenyl) propane, bis(3-amino-4-hydroxyphenyl) methylene, bis(3-amino-4-hydroxyphenyl) ether, bis(3-amino-4-hydroxy) biphenyl, and 9,9-bis(3-amino-4-hydroxyphenyl) fluorene; bis(aminobenzoyl) compounds such as 2,2'-bis[N-(3-aminobenzoyl)-3-amino-4-hydroxyphenyl] hexafluoropropane, 2,2'-bis[N-(4-aminobenzoyl)-3-amino-4-hydroxyphenyl] hexafluoropropane, 2,2'-bis[N-(3-aminobenzoyl)-3-amino-4-hydroxyphenyl] propane, 2,2'-bis[N-(4-aminobenzoyl)-3- amino-4-hydroxyphenyl] propane, bis[N-(3-aminobenzoyl)-3-amino-4-hydroxyphenyl] sulfone, bis[N-(4-aminobenzoyl)-3-amino-4-hydroxyphenyl] sulfone, 9,9-bis[N-(3-aminobenzoyl)-3-amino-4-hydroxyphenyl] fluorene, 9,9-bis[N-(4-aminobenzoyl)-3-amino-4-hydroxyphenyl] fluorene, N, N'-bis(3-aminobenzoyl)-2,5-diamino-1,4-dihydroxy benzene, N, N'-bis(4-aminobenzoyl)-2,5-diamino-1, 4-dihydroxy benzene, N, N'-bis(3-aminobenzoyl)-4,4'-diamino-3,3-dihydroxy biphenyl, N, N'-bis(4-aminobenzoyl)-4,4'-diamino-3,3-dihydroxy biphenyl, N, N'-bis(3-aminobenzoyl)-3,3'-diamino-4,4-dihydroxy biphenyl, and N, N'-bis(4-aminobenzoyl)-3,3'-diamino-4,4-dihydroxy biphenyl; heterocycle-containing diamine compounds such as 2-(4-aminophenyl)-5-aminobenzoxazole, 2-(3-aminophenyl)-5-aminobenzoxazole, 2-(4-aminophenyl)-6-aminobenzoxazole, 2-(3-aminophenyl)-6-aminobenzoxazole, 1,4-bis(5-amino-2-benzoxazolyl) benzene, 1,4-bis(6-amino-2-benzoxazolyl) benzene, 1,3-bis(5-amino-2-benzoxazolyl) benzene, 1,3-bis(6-amino-2-benzoxazolyl) benzene, 2,6-bis(4-aminophenyl) benzobisoxazole, 2,6-bis(3-aminophenyl) benzobisoxazole, 2,2'-bis[(3-aminophenyl)-5-benzoxazolyl] hexafluoropropane, 2,2'-bis[(4-aminophenyl)-5-benzoxazolyl] hexafluoropropane, bis[(3-aminophenyl)-5-benzoxazolyl], bis[(4-aminophenyl)-5-benzoxazolyl], bis[(3-aminophenyl)-6-benzoxazolyl], and bis[(4-aminophenyl)-6-benzoxazolyl]; and compounds produced from these diamine compounds by replacing one or more of the hydrogen atoms bonded to their aromatic rings with hydrocarbons or halogen atoms.

Examples of aliphatic diamine compounds include linear diamine compounds such as ethylene diamine, propylene diamine, butane diamine, pentane diamine, hexane diamine, octane diamine, nonane diamine, decane diamine, undecane diamine, dodecane diamine, tetramethyl hexane diamine, 1,12-(4,9-dioxa) dodecane diamine, 1,8-(3,6-dioxa) octane diamine, and 1,3-bis(3-aminopropyl) tetramethyl disiloxane; alicyclic diamine compounds such as cyclohexane diamine, 4,4'-methylene bis(cyclohexyl amine), and isophorone diamine; the polyoxyethylene amine and polyoxypropylene amine products under the trade name of Jeffamine (manufactured by Huntsman Corporation) and copolymeric compounds thereof.

These diamines may be used in their original form or in the form of corresponding trimethylsilylated diamines. Two or more thereof may be used in combination.

From the viewpoint of prevention of film lifting, it is preferable that 50 mol % or more of the total quantity of diamine compounds be accounted for by aromatic diamine compounds, as described later. In particular, it is preferable that a divalent diamine residue as represented by chemical formula (7) be the primary component in D and F.

[Chemical compound 6]

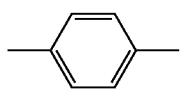

(7)

This suggests that it is preferable to adopt p-phenylene diamine as primary component. For the present invention, the term "primary component" above refers to one that accounts for 50 mol % or more of the total quantity of diamine compounds. It is more preferable for the proportion to be 80 mol % or more. Those polyimides produced from p-phenylene diamine form film with a small coefficient of thermal linear expansion and ensure a small stress and little film lifting during film formation on a substrate.

It is particularly preferable that C and E in chemical formulae (3) and (4) each contain a tetravalent tetracarboxylic acid residue as represented by chemical formula (5) or (6) as primary component and that D and F each contain a divalent diamine residue as represented by chemical formula (7) as primary component. Those polyimides having such a structure form film with a small coefficient of thermal linear expansion and ensure a small stress and little film lifting during film formation on a substrate.

Silicon-containing diamine such as 1,3-bis(3-aminopropyl)tetramethyl disiloxane and 1,3-bis(4-anilino)tetramethyl disiloxane may be adopted with the aim of increasing the coatability on a support and the resistance to oxygen plasma used for cleaning and the like and to UV ozone processing. It is preferable that these silicon-containing diamine compounds account for 1 to 30 mol % of the total quantity of diamine compounds.

For the diamine compounds given above as examples, one or more of the hydrogen atoms contained in a diamine compound may be replaced with a hydrocarbon group containing 1 to 10 carbon atoms such as methyl group and ethyl group; a fluoroalkyl group containing 1 to 10 carbon atoms such as trifluoromethyl group; or other groups such as F, Cl, Br, and I. Being able to serving for improving the solubility of the heat resistant resin or precursor thereof in an aqueous alkali solution, furthermore, substitution of acidic groups such as OH, COOH, $SO_3H$, $CONH_2$, and $SO_2NH_2$ is preferable when preparing a photosensitive resin composition as described later.

In the polyimide or polyamic acid used for the present invention, the chains may be terminated with end capping agents. Reacting the polyimide or polyamic acid with an end capping agent can serve to control the molecular weight in a preferable range.

If the polyimide or polyamic acid has a diamine compound as the terminal monomer, the amino group can be capped by using a dicarboxylic anhydride, monocarboxylic acid, monocarboxylic chloride compound, monocarboxylic acid active ester compound, dialkyl dicarbonate, or the like as end capping agent.

If the polyimide or polyamic acid has a dianhydride as the terminal monomer, the dianhydride can be capped by using a monoamine, monoalcohol, or the like as end capping agent.

For the resin composition according to the present invention, the concentration of the heat resistant resin or precursor thereof is preferably 3 mass % or more, and more preferably 5 mass % or more, of 100 mass % of the resin composition. The proportion is preferably 40 mass % or less, more preferably 30 mass % or less. The heat resistant resin or precursor thereof can serve to produce a thick film if its concentration is 3 mass % or more, whereas the heat resistant resin or precursor thereof will be dissolved completely to ensure uniform film formation if it is 40 mass % or less.

The resin composition according to the present invention preferably has a viscosity of 20 to 10,000 mPa·s, more preferably 50 to 8,000 mPa·s. It will be impossible to produce a film with a sufficiently large film thickness if the viscosity is less than 20 mPa·s, whereas coating with the varnish will be difficult if it is more than 10,000 mPa·s.

When measured by gel permeation chromatography, the heat resistant resin or a precursor thereof used for the present invention preferably has a polystyrene-based weight average molecular weight of 200,000 or less, more preferably 150, 000 or less, and still more preferably 100,000 or less. For a resin composition in this range, its viscosity increase can be prevented even when it has a high concentration. On the other hand, the weight average molecular weight is preferably 2,000 or more, more preferably 3,000 or more, and still more preferably 5,000 or more. If the weight average molecular weight is 2,000 or more, resin compositions formed therefrom will not suffer from a significant decrease in viscosity and can maintain higher coatability.

There are no specific limitations on the number of repetitions in chemical formulae (3) and (4) as long as the weight average molecular weight is in the above ranges. It is preferably 5 or more, and more preferably 10 or more. On the other hand, it is preferably 1,000 or less, and more preferably 500 or less.

(Additives)

The resin composition according to the present invention may contain at least one additive selected from the following: (a) photoacid generation agent, (b) thermal crosslinking agent, (c) thermal acid generating agent, (d) compound containing a phenolic hydroxy group, (e) inorganic particles, and (f) surface active agent.

(a) Photoacid Generation Agent

The resin composition according to the present invention can work as a photosensitive resin composition if containing a photoacid generation agent. The existence of a photoacid generating agent serves to produce an acid in light-irradiated portions so that the irradiated part increases in solubility in aqueous alkali solutions, resulting in a positive type relief pattern in which the irradiated portion is dissolvable. If an epoxy compound or such a thermal crosslinking agent as described later is contained in addition to the photoacid generating agent, an acid is generated in light-irradiated portions to promote crosslinking reaction of the epoxy compound or thermal crosslinking agent, resulting in a negative type relief pattern in which the irradiated portions are insolubilized.

Examples of such a photoacid generating agent include quinone diazide compounds, sulfonium salts, phosphonium salts, diazonium salts, and iodonium salts. Two or more thereof may be contained, and a photosensitive resin composition with high sensitivity can be obtained.

Useful quinone diazide compounds include polyhydroxy compounds bonded to sulfonic acid of quinone diazide through ester linkage, polyamino compounds bonded to sulfonic acid of quinone diazide through sulfonamide linkage, and polyhydroxypolyaminno compounds bonded to sulfonic acid of quinone diazide through ester linkage and/or sulfonamide linkage. It is preferable that 50 mol % or more of the functional groups in the polyhydroxy compounds and polyamino compounds be replaced with quinone diazide.

For the quinone diazide used for the present invention, both 5-naphthoquinone diazide sulfonyl group and 4-naphthoquinone diazide sulfonyl group are preferred. A 4-naphthoquinone diazide sulfonyl ester compound absorbs light in the i-line range of mercury lamps, and therefore, it is suitable for i-line light exposure. A 5-naphthoquinone diazide sulfonyl ester compound absorbs light in a region including the g-line of mercury lamps, and therefore, it is suitable for g-line light exposure. For the present invention, it is preferable to adopt either a 4-naphthoquinone diazide sulfonyl ester compound or a 5-naphthoquinone diazide sulfonyl ester compound depending on the wavelength of the light used for exposure. Furthermore, the agent may contain a naphthoquinone diazide sulfonyl ester compound having both a 4-naphthoquinone diazide sulfonyl group and a 5-naphthoquinone diazide sulfonyl group in one molecule, or the resin composition to be used may contain both a 4-naphthoquinone diazide sulfonyl ester compound and a 5-naphthoquinone diazide sulfonyl ester compound.

Of the examples of photoacid generating agent, the sulfonium salt, phosphonium salt, and diazonium salt are preferable because they can stabilize moderately the acid component produced by light exposure. The use of a sulfonium salt is particularly preferable. In addition, a sensitization agent and the like may also be contained as needed.

For the present invention, the content of the photoacid generating agent is preferably 0.01 to 50 parts by mass relative to 100 parts by mass of the resin from the viewpoint of increasing the sensitivity. Of the above ones, the quinone diazide compound preferably accounts for 3 to 40 parts by mass. The total content of the sulfonium salt, phosphonium salt, and diazonium salt is preferably 0.5 to 20 parts by mass.

(b) Thermal Crosslinking Agent

The resin composition according to the present invention may contain a thermal crosslinking agent as shown by chemical formula (31) given below or a thermal crosslinking agent containing a structure as shown by chemical formula (32) given below (hereinafter, both are referred to as thermal crosslinking agents). These thermal crosslinking agents can crosslink heat resistant resin or precursor thereof and other additive components, thereby serving to produce heat resistant resin film with enhanced chemical resistance and hardness.

[Chemical compound 7]

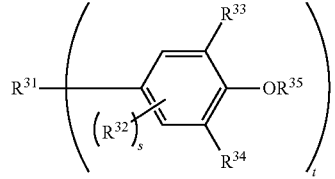

(31)

In the above chemical formula (31), $R^{31}$ denotes a di- to tetra-valent linking group. $R^{32}$ denotes a monovalent hydrocarbon group containing 1 to 20 carbon atoms, Cl, Br, I, or F $R^{33}$ and $R^{34}$ each independently denote $CH_2OR^{36}$ (where $R^{36}$ is a hydrogen atom or a monovalent hydrocarbon group containing 1 to 6 carbon atoms. $R^{35}$ is a hydrogen atom, methyl group, or ethyl group. Furthermore, s is an integer of 0 to 2, and t is an integer of 2 to 4. If a plurality of $R^{32}$ groups exist, they may be identical to or different from each other. If a plurality of $R^3$ and $R^{34}$ groups exist, they may be identical to or different from each other. If a plurality of $R^{35}$ groups exist, they may be identical to or different from each other. Examples of the linking group $R^{31}$ are listed below.

[Chemical Compound 8]

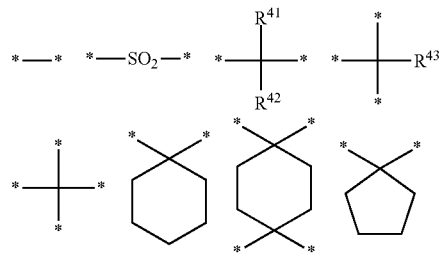

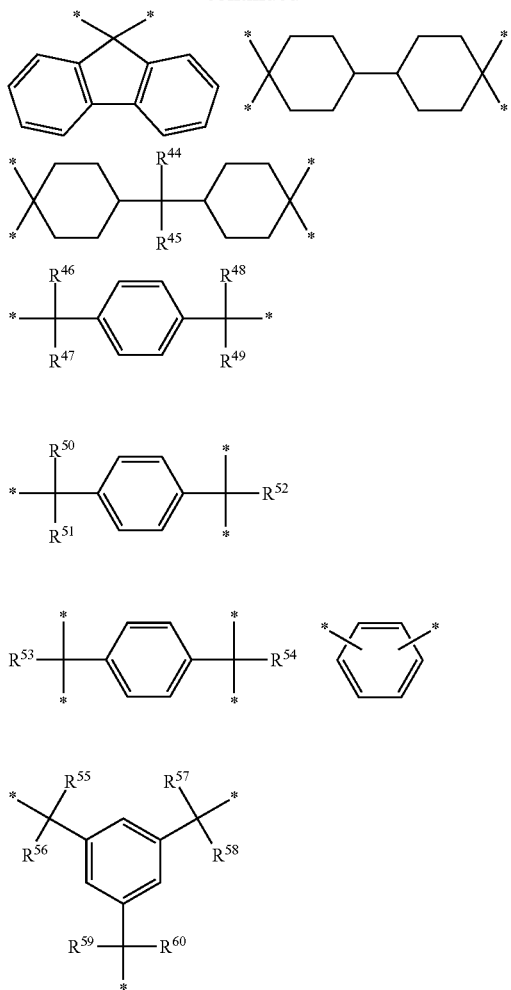

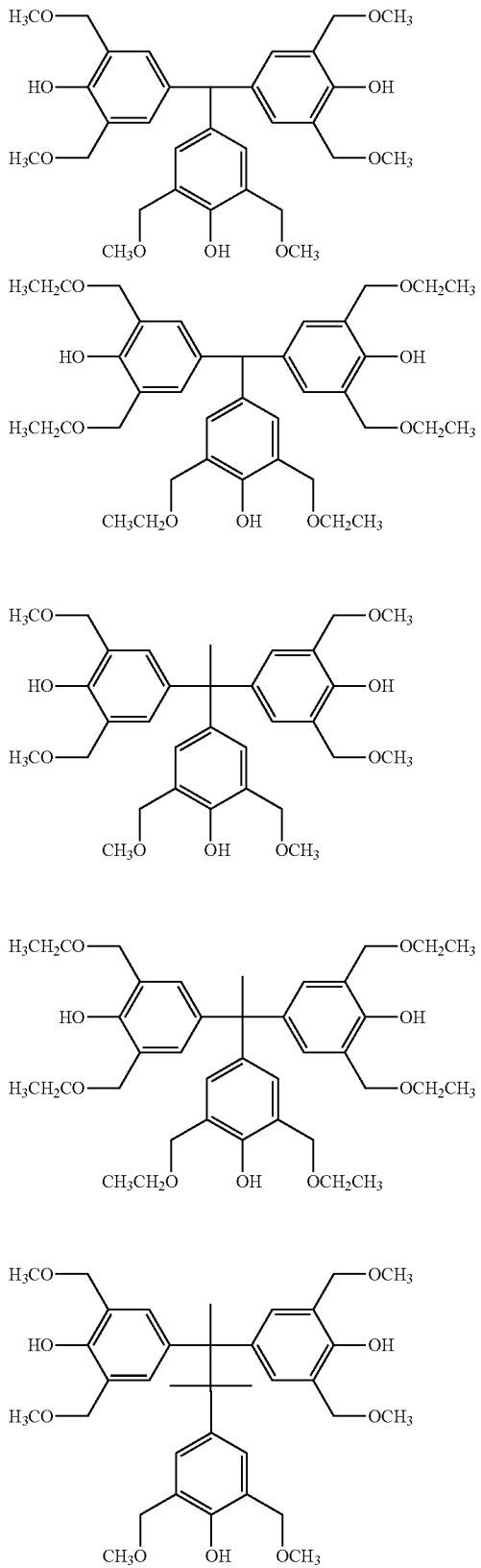

[Chemical compound 10]

In the above chemical formulae, $R^{41}$ to $R^{60}$ each denote a hydrogen atom or a monovalent hydrocarbon group containing 1 to 20 carbon atoms in which one or more of the hydrogen atoms may be replaced with Cl, Br, I, or F. The symbol * denotes the bonding points of $R^{31}$ in chemical formula (31).

[Chemical compound 9]

$$—N(CH_2OR^{37})_u(H)_v \quad (32)$$

In the above chemical formula (32), $R^{37}$ denotes a hydrogen atom or a monovalent hydrocarbon group containing 1 to 6 carbon atoms. In addition, u denotes 1 or 2, and v denotes 0 or 1. Here, u+v is equal to 1 or 2.

$R^{33}$ and $R^{34}$ in chemical formula (31) given above each denote $CH_2OR^{36}$, which is a thermal crosslinking group. $R^{36}$ is preferably a monovalent hydrocarbon group containing 1 to 4 carbon atoms, more preferably a methyl group or ethyl group, to allow the thermal crosslinking agent of chemical formula (31) to maintain a moderate degree of reactivity and high storage stability.

Preferable examples of thermal crosslinking agents containing a structure as represented by chemical formula (31) are listed below.

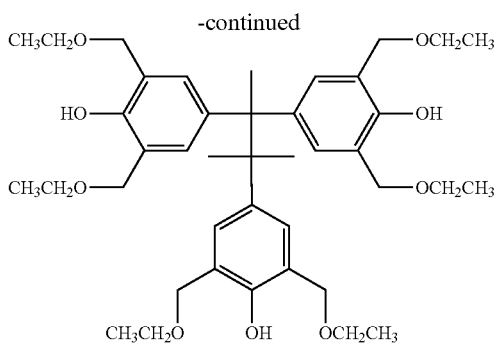

In chemical formula (32), $R^{37}$ is preferably a monovalent hydrocarbon group containing 1 to 4 carbon atoms. Furthermore, from the viewpoint of stability of the compound and storage stability of the photosensitive resin composition, $R^{37}$ is preferably a methyl group or ethyl group and the compound preferably contains 8 or less ($CH_2OR^{37}$) groups.

Preferable examples of thermal crosslinking agents containing a group as represented by chemical formula (32) are listed below.

[Chemical compound 11]

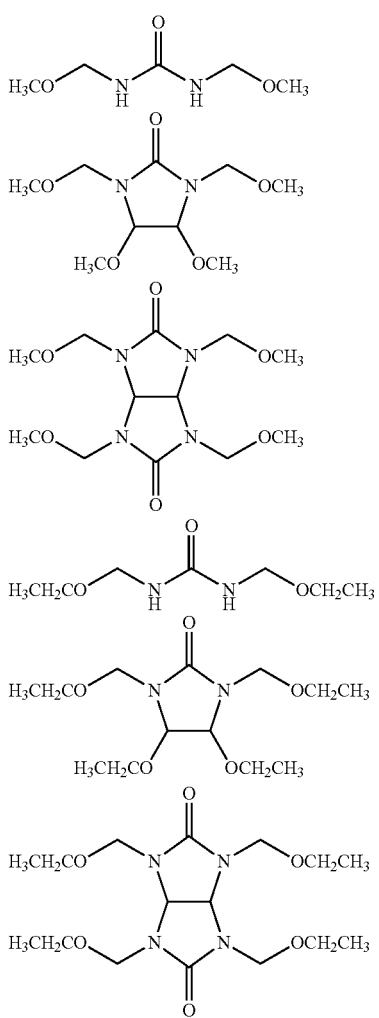

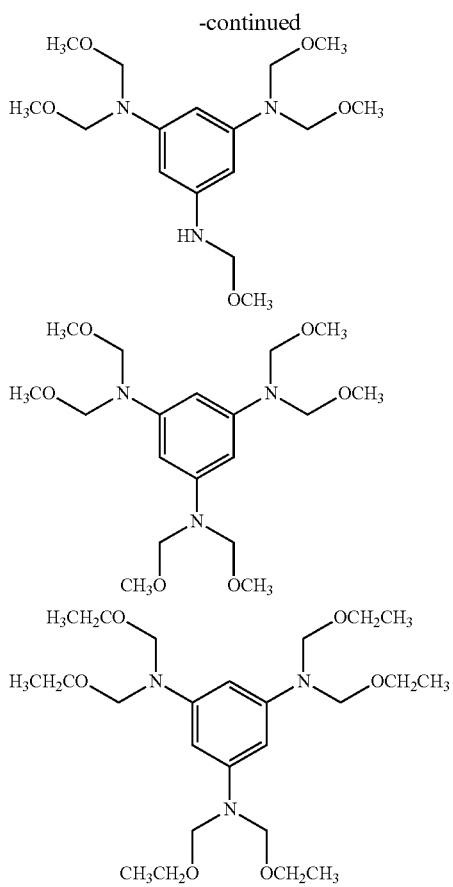

The content of the thermal crosslinking agent is preferably 10 parts by mass or more and 100 parts by mass or less relative to 100 parts by mass of the resin. If the content of the thermal crosslinking agent is 10 parts by mass or more and 100 parts by mass or less, it ensures the production of a heat resistant resin film with high strength and a resin composition with high storage stability.

(c) Thermal Acid Generating Agent

The varnish according to the present invention may further contain a thermal acid generating agent. A thermal acid generating agent generates an acid when heated after development as described below to promote the crosslinking reaction between the heat resistant resin or precursor thereof and the thermal crosslinking agent and also promote the curing reaction. This serves to provide a heat resistant resin film with an improved chemical resistance and a reduced film loss. The acid generated by the thermal acid generating agent is preferably a strong acid, which is preferably an aryl sulfonic acid such as p-toluene sulfonic acid and benzene sulfonic acid, or an alkyl sulfonic acid such as methane sulfonic acid, ethane sulfonic acid, and butane sulfonic acid. For the present invention, the thermal acid generating agent is preferably an aliphatic sulfonic acid compound as represented by chemical formula (33) or (34), and two or more of such compounds may be contained.

[Chemical compound 12]

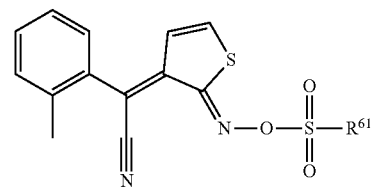
(33)

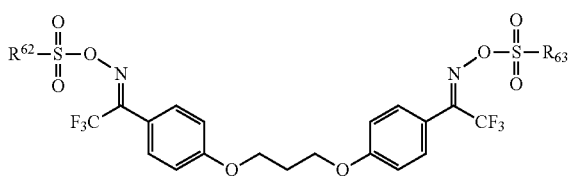
(34)

In chemical formulae (33) and (34) given above, $R^{61}$ to $R^{63}$, which may be identical to or different from each other, each denote an organic group containing 1 to 20 carbon atoms, which is preferably a hydrocarbon group containing 1 to 20 carbon atoms. They may be organic groups each containing 1 to 20 carbon atoms and containing atoms of hydrogen and carbon as essential elements and atoms of one or more elements selected from the group of boron, oxygen, sulfur, nitrogen, phosphorus, silicon, and halogens.

Specific examples of such compounds as represented by chemical formula (33) are listed below.

[Chemical compound 13]

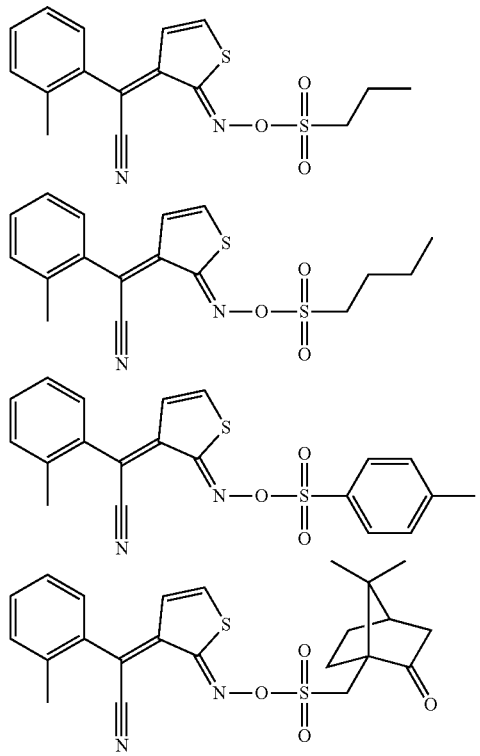

Specific examples of such compounds as represented by chemical formula (34) are listed below.

[Chemical compound 14]

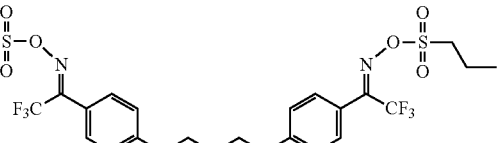

The content of the thermal acid generating agent is preferably 0.5 part by mass or more and 10 parts by mass or less relative to 100 parts by mass of the resin from the viewpoint of promoting the crosslinking reaction.

(d) Compound Containing Phenolic Hydroxy Group

The photosensitive resin composition may contain a compound having a phenolic hydroxy group as required with the aim of helping the alkaline development thereof. Examples of such a compound having a phenolic hydroxy group include, for example, the products available from Honshu Chemical Industry Co., Ltd., under the following trade names: Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylene tris-FR-CR, BisRS-26X, and BisRS-OCHP; the products available from Asahi Organic Chemicals Industry Co., Ltd., under the following trade names: BIR-OC, BIP-PC, BIR-PC, BIR-PTBP, BIR-PCHP, BIP-BIOC-F, 4PC, BIR-BIPC-F, and TEP-BIP-A; and others including 1,4-dihydroxy naphthalene, 1,5-dihydroxy naphthalene, 1,6-dihydroxy naphthalene, 1,7-dihydroxy naphthalene, 2,3-dihydroxy naphthalene, 2,6-dihydroxy naphthalene, 2,7-dihydroxy naphthalene, 2,4-dihydroxy quinoline, 2,6-dihydroxy quinoline, 2,3-dihydroxy quinoxaline, anthracene-1,2,10-triol, anthracene-1,8,9-triol, and 8-quinolinol. If such a compound having a phenolic hydroxy group is contained, the resulting photosensitive resin composition will be scarcely dissolved in an alkaline developer before light exposure, but will be easily dissolved in an alkaline developer after light exposure, leading to a decreased film loss during development and ensuring rapid and easy development. Accordingly, the sensitivity can be improved easily.

Such a compound having a phenolic hydroxy group preferably accounts for 3 parts by mass or more and 40 parts by mass or less relative to 100 parts by mass of the resin.

(e) Inorganic Particles

The resin composition according to the present invention may contain inorganic particles with the aim of improving the heat resistance. Materials of inorganic particles used for this aim include metals such as platinum, gold, palladium, silver, copper, nickel, zinc, aluminum, iron, cobalt, rhodium, ruthenium, tin, lead, bismuth, and tungsten and metal oxides such as silicon oxide (silica), titanium oxide, aluminum oxide, zinc oxide, tin oxide, tungsten oxide, zirconium oxide, calcium carbonate, and barium sulfate. There are no specific limitations on the shape of these inorganic particles, and they may be spherical, elliptic, flattened, rod-like, fibrous, etc. To prevent an increase in the surface roughness of a heat resistant resin film containing inorganic particles, the average particle diameter of the inorganic particles is preferably 1 nm or more and 100 nm or less, more preferably 1 nm or more and 50 nm or less, and still more preferably 1 nm or more and 30 nm or less.

The content of the inorganic particles is preferably 3 parts by mass or more, more preferably 5 parts by mass or more, and still more preferably 10 parts by mass or more, and preferably 100 parts by mass or less, more preferably 80 parts by mass or less, and still more preferably 50 parts by mass or less, relative to 100 parts by mass of the resin. The heat resistance will be sufficiently high if the content of the inorganic particles is 3 parts by mass or more, and the heat resistant resin film will have sufficiently high toughness if it is 100 parts by mass or less.

(f) Surface Active Agent

The resin composition according to the present invention may contain a surface active agent in order to improve the coatability. Useful surface active agents include fluorochemical surface active agents such as Fluorad (registered trademark) manufactured by Sumitomo 3M, Megafac (registered trademark) manufactured by DIC Corporation, Surflon (registered trademark) manufactured by Asahi Glass Co., Ltd.; organic siloxane surface active agents such as KP341 manufactured by Shin-Etsu Chemical Co., Ltd., DBE manufactured by Chisso Corporation, Polyflow (registered trademark) and Glanol (registered trademark) manufactured by Kyoeisha Chemical Co., Ltd., and BYK manufactured by BYK-Chemie; and acrylic polymer surface active agents such as Polyflow manufactured by Kyoeisha Chemical Co., Ltd. The content of these surface active agents is preferably 0.01 to 10 parts by mass relative to 100 parts by mass of the resin.

(Production Method for Resin Composition).

Next, the method for producing the resin composition according to the present invention is described below.

A resin composition in the form of varnish according to an embodiment of the present invention can be produced by, for example, dissolving a heat resistant resin or a precursor thereof in a solvent together with a silane compound, photoacid generating agent, thermal crosslinking agent, thermal acid generating agent, compound having a phenolic hydroxy group, inorganic particles, surface active agent, or the like, as required. This dissolution can be carried out by stirring, heating, etc. If a photoacid generating agent is contained, an appropriate heating temperature is adopted in a range, commonly from room temperature to 80° C., where a photosensitive resin composition with unimpaired performance is obtained. There are no specific limitations on the order of dissolving these components, and for example, the compound with the lowest solubility may be dissolved first followed by the others in the order of solubility. Alternatively, the dissolution of those components, such as surface active agent, that are likely to form bubbles when dissolved by stirring may be preceded by the dissolution of the other components so that the dissolution of the latter will not be hindered by bubble formation.

The heat resistant resin or precursor thereof can be polymerized by a known method. In the case of polyimide, for example, polyamic acid, which serves as precursor, can be produced by polymerizing an acid component, such as tetracarboxylic acid and corresponding acid dianhydride, active ester, and active amide, with a diamine component, such as diamine and corresponding trimethylsilylated diamine, in a reaction solvent. Moreover, the carboxyl group in the polyamic acid may be in a salified state with alkali metal ion, ammonium ion, or imidazolium ion or in an esterified state with a hydrocarbon group containing 1 to 10 carbon atoms or an alkyl silyl group containing 1 to 10 carbon atoms. Polybenzoxazole can be produced through a condensation reaction between a bisaminophenol compound and dicarboxylic acid. Specifically, available methods include a method in which an acid is reacted with a dehydration condensation agent such as dicyclohexyl carbodiimide (DCC), followed by adding a bisaminophenol compound, and a method in which a tertiary amine such as pyridine is added to a solution of a bisaminophenol compound, followed by dropping a solution of dicarboxylic dichloride.

(Resin 1), that is, a resin wherein 50 mol % or more of the repeating units are represented by chemical formula (3); the repeating units represented by chemical formula (3) and those by chemical formula (4) are contained at a molar ratio of 95:5 to 75:25; and $R^4$ and $R^5$ in chemical formula (3) are each a hydrogen atom, is produced preferably by the method described below.

Specifically, a diamine compound and tetracarboxylic acid are reacted to produce polyamic acid in the first step and part of the repeating units in the polyamic acid are imidized in the second step.

On the other hand, (Resin 2), that is, a resin wherein 50 mol % or more of the repeating units are represented by chemical formula (3), and 50 to 95 mol % of the groups represented by $R^4$ or $R^5$ in chemical formula (3) are hydrocarbon groups containing 1 to 10 carbon atoms, is produced preferably by the method described below.

Specifically, a diamine compound and tetracarboxylic acid are reacted to produce polyamic acid in the first step and part of the carboxy groups in the polyamic acid are esterified in the second step.

Useful reaction solvents include, for example, amides such as N-methyl-2-pyrolidone, N-ethyl-2-pyrolidone, N,N-dimethyl formamide, N,N-dimethyl acetamide, 3-methoxy-N,N-dimethyl propione amide, 3-butoxy-N,N-dimethyl propione amide, N-methyl-2-dimethyl propione amide, N-ethyl-2-methyl propione amide, N-methyl-2,2-dimethyl propione amide, N-methyl-2-methyl butane amide, N,N-dimethyl isobutyl amide, N, N-dimethyl-2-methyl butane amide, N,N-dimethyl-2,2-dimethyl propione amide, N-ethyl-N-methyl-2-methyl propione amide, N,N-dimethyl-2-methyl pentane amide, N,N-dimethyl-2,3-dimethyl butane amide, N,N-dimethyl-2-ethyl butane amide, N,N-diethyl-2-methyl propione amide, N,N-dimethyl-2,2-dimethyl butane amide, N-ethyl-N-methyl-2,2-dimethyl propione amide, N-methyl-N-propyl-2-methyl propione amide, N-methyl-N-(1-methyl ethyl)-2-methyl propione amide, N,N-diethyl-2,2-dimethyl propione amide, N,N-dimethyl-2,2-dimethyl pentane amide, N-ethyl-N-(1-methyl ethyl)-2-methyl propione amide, N-methyl-N-(2-methyl propyl)-2-methyl propione amide, N-methyl-N-(1-methyl ethyl)-2,2-dimethyl propione amide, and N-methyl-N-(1-methyl propyl)-2-methyl propione amide; esters such as γ-butyrolactone, ethyl acetate, propylene glycol monomethyl ether acetate, and ethyl lactate; ureas such as 1,3-dimethyl-2-imidazolidinone, N,N'-dimethyl propylene urea, and 1,1,3,3-tetramethyl urea; sulfoxides such as dimethyl sulfoxide and tetramethylene sulfoxide; sulfones such as dimethyl sulfone and sulfolane; ketones such as acetone, methyl ethyl ketone, diisobutyl ketone, diacetone alcohol, and cyclohexanone; ethers such as tetrahydrofuran, dioxane, propylene glycol monomethyl ether, propylene glycol monoethyl ether, diethylene glycol monomethyl ether, diethylene glycol monoethyl ether, diethylene glycol ethyl methyl ether, and diethylene glycol dimethyl ether, aromatic hydrocarbons such as toluene and xylene; alcohols such as methanol, ethanol, and isopropanol; and water; which may be used singly or a plurality of which may be used in combination.

It is preferable for the quantity of the reaction solvent to be adjusted so that the tetracarboxylic acid and diamine compound altogether account for 0.1 to 50 mass % of the total quantity of the reaction solution. The reaction temperature is preferably −20° C. to 150° C., and more preferably 0° C. to 100° C. Furthermore, the reaction period is preferably 0.1 to 24 hours, and more preferably 0.5 to 12 hours. For the reaction in the first step, it is preferable for the number of moles of the diamine compound to be equal to that of the tetracarboxylic acid. When they are equal, a resin film having good mechanical characteristics can be obtained easily from the resin composition.

The polyamic acid resulting from the first step may be used directly as the heat resistant resin precursor for the present invention. In this case, the target resin composition can be obtained without isolating the resin if the same solvent as intended for the resin composition is adopted as the reaction solvent or the solvent is added after the completion of the reaction. Furthermore, the polyamic acid obtained may be used for the reaction in the second step. In this case, the reaction solution resulting from the first step may be applied directly to the reaction in the second step, or it may be used for the reaction in the second step after isolating the polyamic acid. For the reaction in the second step as well, the target resin composition can be obtained without isolating the resin if the same solvent as intended for the resin composition is adopted as the reaction solvent or the solvent is added after the completion of the reaction.

In the case where imidization is to be performed as the second step reaction, it is preferable for the imidization to be carried out by a method designed to heat a polyamic acid or a method designed to adding a dehydrator and imidization catalyst, followed by heating if required. The former method is more preferable because the latter method requires a step for removing the reactant of the dehydrator, the imidization catalyst, and the like.

Use examples of the dehydrator include anhydrides such as acetic anhydride, propionic anhydride, and trifluoroacetic anhydride.

Use examples of the imidization catalyst include tertiary amines such as 1-methyl imidazole, 2-methyl imidazole, 1,2-dimethyl imidazole, pyridine, collidine, lutidine, and triethyl amine.

The quantity of the dehydrator and imidization catalyst should preferably be adjusted appropriately depending on the intended degree of imidization.

Useful reaction solvents for the imidization include those listed for the first step reaction.

The imidization temperature is preferably 0° C. to 180° C., and more preferably 10° C. to 150° C. The reaction time is preferably 1.0 to 120 hours, and more preferably 2.0 to 30 hours. Setting an appropriate reaction temperature and reaction time in these ranges ensures an intended degree of imidization of the polyamic acid.

In the case where esterification is to be performed as the second step reaction, it is preferable for the esterification to be carried out by a method designed to cause reaction with an esterifying agent or a method designed to cause reaction with an alcohol in the presence of a dehydration condensation agent.

Useful examples of the esterifying agent include orthoesters such as trimethyl orthoformate, triethyl orthoformate, trimethyl orthoacetate, N,N-dimethyl formamide dimethyl acetal, and N,N-diethyl formamide dimethyl acetal.

Useful examples of the dehydration condensation agent include carbodiimides such as N,N'-dicyclohexyl carbodiimide and N,N'-diisopropyl carbodiimide; azodicarboxylates such as dimethyl azodicarboxylate, diethyl azodicarboxylate, and diisopropyl azodicarboxylate; and N,N'-carbonyl diimidazole.

Useful examples of the alcohol include methyl alcohol, ethyl alcohol, n-propyl alcohol, n-butyl alcohol, n-pentyl alcohol, n-hexyl alcohol, n-heptyl alcohol, n-octyl alcohol, n-nonyl alcohol, n-decyl alcohol, isopropyl alcohol, isobutyl alcohol, sec-butyl alcohol, tert-butyl alcohol, isopentyl alcohol, sec-pentyl alcohol, tert-pentyl alcohol, isohexyl alcohol, sec-hexyl alcohol, cyclopropyl alcohol, cyclobutyl alcohol, cyclopentyl alcohol, cyclohexyl alcohol, cycloheptyl alcohol, cyclooctyl alcohol, norbomyl alcohol, and adamanthyl alcohol.

Useful reaction solvents for the esterification include those listed for the first step reaction.

The esterification temperature is preferably 0° C. to 80° C., and more preferably 10° C. to 60° C. The reaction period is preferably 0.1 to 20 hours, and more preferably 0.5 to 5 hours. Setting an appropriate reaction temperature and reaction time in these ranges ensures an intended degree of esterification of the polyamic acid.

The resulting varnish is preferably filtrated through a filter to remove dust and particles. Filters with a pore size of, for example, 10 µm, 3 µm, 1 µm, 0.5 µm, 0.2 µm, 0.1 µm, 0.07 µm, or 0.05 µm are available, though there are no specific limitations on the size. The filter to be used for the filtration may be of such a material as polypropylene (PP), polyethylene (PE), nylon (NY), and polytetrafluoroethylene (PTFE), of which polyethylene and nylon are preferable.

Next, the method for producing a heat resistant resin film from the resin composition according to the present invention is described below.

First, a varnish according to an embodiment of the present invention is spread over a support. There are no specific limitations on the support, but useful ones include wafer substrates of silicon, gallium arsenide, or the like, glass substrates of sapphire glass, soda lime glass, alkali-free glass, or the like, metal substrates or metal foils of stainless steel, copper, or the like, ceramics substrates, and inorganic films containing silicon and one or more additional elements selected from the group consisting of nitrogen, oxygen, and carbon.

Useful varnish coating methods include spin coating, slit coating, dip coating, spray coating, and printing, which may be used in combination. When using a heat resistant resin as substrate for a display device, it will be necessary to spread it over a support of a large size and accordingly, the use of the slit coating method is particularly preferable.

Here, if the varnish has a large surface tension, the film will be thicker particularly at the starting point of the slit coating, resulting in a swollen shape at the edge compared to the inner portions of the film. Being low in surface tension, however, the resin composition according to the present invention has the advantage of forming a coating film with a moderate thickness when applied by slit coating on a support.

In addition, when slit coating is performed, the coatability changes with viscosity, making it necessary to readjust the slit coating apparatus. This means that the changes in the viscosity of the varnish should preferably be as small as possible. The viscosity change should preferably be in the range of ±10% or less. It is more preferably ±5% or less, and still more preferably ±3% or less. A viscosity change in the range of ±10% or less ensures the production of a heat resistant resin film with a film thickness range of 10% or less.

If pinholes are formed in the film produced by coating a support with the resin composition, the resulting heat resistant resin film will suffer from deterioration in barrier properties. Accordingly, the number of pinholes formed in the coating film should preferably be as small as possible. For a substrate with a length of 350 mm and a width of 300 mm, for example, the number of pinholes formed should preferably be 10 or less, more preferably 2 or less, and still more preferably 0.

The support may be pre-treated in advance before coating. For example, a pretreatment agent may be dissolved to 0.5 to 20 mass % in a solvent such as isopropanol, ethanol, methanol, water, tetrahydrofuran, propylene glycol monomethyl ether acetate, propylene glycol monomethyl ether, ethyl lactate, and diethyl adipate to prepare a solution, which is then used to treat the support surface by an appropriate technique such as spin coating, slit die coating, bar coating, dip coating, spray coating, and steam processing. Vacuum drying may be carried out as required, followed by heat treatment at 50° C. to 300° C. to accelerate the reaction between the support and the pretreatment agent.

The coating step is commonly followed by drying the varnish coating film. Useful drying methods include reduced pressure drying methods, thermal drying methods, and combinations thereof. The reduced pressure drying methods include, for example, a process in which a support with a coating film formed on its surface is put in a vacuum chamber, followed by reducing the pressure in the vacuum chamber. Thermal drying may be performed by using a tool such as hot plate, oven, and infrared ray. When using a hot plate, the coating film is put directly on the plate or held on jigs such as proxy pins fixed on the plate, followed by heat-drying.

There are various proxy pins of different materials including metals such as aluminum and stainless steel and synthetic resins such as polyimide resin and Teflon (registered trademark), and any types of proxy pins may work effectively if they have heat resistance. An appropriate proxy pin height may be adopted depending on the support size, type of the solvent used in the varnish, drying method used, etc., but it is preferably about 0.1 to 10 mm. Depending on the type and purpose of the solvent used in the varnish, heating is performed preferably at a temperature in the range from room temperature to 180° C. for 1 minute to several hours.

When the heat resistant resin composition according to the present invention contains a photoacid generating agent, a pattern can be formed by processing the dried coat film by the method described below. To perform light exposure, an actinic ray is applied to the coat film through a mask of an intended patter. Different types of actinic ray available for the light exposure include ultraviolet ray, visible light, electron beam, and X-ray, and in particular, the i-line (365 nm), h-line (405 nm), and g-line (436 nm) of mercury lamps are preferred for the invention. If the film is positively photosensitive, the exposed parts are dissolved by a developer. If the film is negatively photosensitive, the exposed parts harden and become insoluble in a developer.

After the exposure step, a developer is used to remove the exposed parts of a positive film or unexposed parts of a negative film to form an intended pattern. Regardless of whether the film is positive or negative, preferable developers include an aqueous solution of alkaline compounds such as tetramethyl ammonium, diethanol amine, diethyl aminoethanol, sodium hydroxide, potassium hydroxide, sodium carbonate, potassium carbonate, trimethyl amine, diethyl amine, methyl amine, dimethyl amine, dimethylaminoethyl acetate, dimethyl aminoethanol, dimethylamino ethyl methacrylate, cyclohexyl amine, ethylene diamine, and hexamethylene diamine. In some cases, polar solvents such as N-methyl-2-pyrolidone, N,N-dimethyl formamide, N,N-dimethyl acetamide, dimethyl sulfoxide, γ-butyrolactone, dimethyl acrylamide, and N,N-dimethyl isobutyl amide; alcohols such as methanol, ethanol, and isopropanol; esters such as ethyl lactate and propylene glycol monomethyl ether acetate; and ketones such as cyclopentanone, cyclohexaone, isobutyl ketone, and methyl isobutyl ketone may be added singly or in combination to such aqueous alkali solutions as listed above. For negative films, it is also possible to use such polar solvents as above that contain no aqueous alkali solution, or alcohols, esters, ketones, etc., which may be added singly or in combination. Commonly, rinsing with water is performed after the development step. Here again, rinsing may be performed with an aqueous solution of an alcohol such as ethanol and isopropyl alcohol, and an ester such as ethyl lactate and propylene glycol monomethyl ether acetate.

Finally, a heat resistant resin film can be produced by performing heat-treatment in the range of 180° C. or more and 600° C. or less to calcine the coat film.

The heat resistant resin film according to the present invention can be used suitably as substrates for display devices such as substrate for flexible organic EL display, substrate for flexible liquid crystal display, substrate for flexible color filter, substrate for flexible electronic paper, and substrate for flexible touch panel. For these applications, the heat resistant resin film preferably has a tensile elongation percentage and tensile maximum stress of 15% or more and 150 MPa or more, respectively.

For the present invention, there are no specific limitations on the film thickness of the heat resistant resin film, but its film thickness is preferably 5 μm or more. It is more preferably 7 μm or more, and still more preferably 10 μm or more. On the other hand, the film thickness is preferably 30 μm or less. It is more preferably 25 μm or less, and still more preferably 20 μm or less. If having a film thickness of 5 μm or more, it will have adequate mechanical characteristics for use as substrate for a display device. If having a film thickness of 30 μm or less, it will have an adequate toughness for use as substrate for a display device.

If the heat resistant resin film is to be used as substrate for a display device, it is preferable for the heat resistant resin film to have a uniform film thickness over the film plane. The in-plane uniformity of film thickness is evaluated on the basis of the film thickness range given by the following equation as indicator.

Film thickness range (%)=(maximum film thickness−minimum film thickness)/(average film thickness)×100

The maximum film thickness, minimum film thickness, and average film thickness referred to herein respectively mean the largest, smallest, and arithmetic mean of measurements taken at different positions on the film plane. In this case, the number of measuring positions is preferably 0.1 to 1/cm$^2$, and the measuring positions are preferably evenly spaced. In addition, the measuring positions are preferably located 10 mm or more inside from the edge of the heat resistant resin film.

The film thickness range is preferably 10% or less. It is more preferably 8% or less, and still more preferably 6% or less. If the heat resistant resin has a film thickness range of 10% or less, its in-plane uniformity of film thickness will be high, and an electronic device formed on the heat resistant resin film will have improved reliability.

The swelling at the edge can be calculated by the following equation.

Swelling at edge (%)=(maximum film thickness at edge−average film thickness)/(average film thickness)×100

The term "edge" as used herein refers to an area with a certain width extending along the edge of the heat resistant resin film. Normally, the width covers 0 to 10 mm from the edge.

FIG. 1 shows a typical cross section of the heat resistant resin film. The film thickness starts to increase from the edge, i.e., the 0 mm point, toward the 10 mm point of the heat resistant resin film, but it turns downward on the way after hitting a peak. The film thickness 103 at this peak is defined as "peak film thickness at edge" and the largest of the measurements of "peak film thickness at edge" taken at a plurality of positions in the plane is used as the "maximum film thickness at edge" in the above equation. The cross-sectional shape at the edge of the heat resistant resin film can be determined using a film thickness gauge or a contour form measuring machine.

The swelling at edge is preferably 15% or less. It is more preferably 10% or less, still more preferably 7% or less, and most preferably 5% or less. An electronic device with similarly improved reliability can be formed on the heat resistant resin film if the swelling at edge is 15% or less.

With respect to the structure, therefore, a display substrate should preferably be in the form of a laminate including a support and a resin film containing, as primary component, a repeating unit as represented by chemical formula (4), the resin film being formed on the support, the resin film having a film thickness range equal to or less than 10% of the average film thickness of the resin film, and the resin film having a swelling at edge equal to or less than 15% of the average film thickness of the resin film.

Described below is a production method for an organic EL display substrate that contains the heat resistant resin film produced by the production method according to the present invention.

The organic EL display substrate may contain an additional film other than the heat resistant resin film and may contain a plurality of heat resistant resin film layers and other film layers. For example, an organic EL display substrate will show good barrier properties if it includes an inorganic film containing atoms of silicon and one or more additional elements selected from the group consisting of nitrogen, oxygen, and carbon, and a first film formed on the inorganic film. If the inorganic film has a second film on the opposite side to the first film, furthermore, the organic EL display substrate will hardly undergo cracking in the inorganic film and will suffer from little deterioration in barrier properties even if cracking occurs. In addition to these features, the heat resistant resin film according to the present invention contains few pinholes and the inorganic film formed thereon will suffer from little deterioration in barrier properties, leading to a final organic EL display with high reliability.

An organic EL display substrate having a heat resistant resin film can be produced by, for example, forming a heat resistant resin film on a glass substrate by the production method according to the present invention. This can be used as-obtained as an organic EL display substrate, but an inorganic film and a heat resistant resin film may be stacked thereon to provide an organic EL display substrate having a first film, an inorganic film, and a second film as described above. More specifically, the organic EL display substrate having a first film, an inorganic film, and a second film can be produced by, for example, the procedure described below. First, a second film is formed on a glass substrate by the production method according to the present invention. The heat resistant resin composition used for this step may be any material that is generally known to serve as a heat resistant resin composition, but from the viewpoint of coatability, it is preferable to adopt the resin composition according to the present invention. From the viewpoint of process simplification, furthermore, the resin composition adopted is preferably the same as the resin composition to be used to produce the first film described later.

Next, an inorganic film containing atoms of silicon and one or more additional elements selected from the group consisting of nitrogen, oxygen, and carbon is formed on the heat resistant resin film. This serves to prevent moisture, oxygen, or the like existing outside the substrate from passing through the heat resistant resin film to cause degradation of the pixel driving device, light emitting device, or the like.

The inorganic film may be of, for example, silicon oxide (SiOx), silicon nitride (SiNy), or silicon oxynitride (SiOxNy), which may be in the form of a monolayer or a plurality of laminated layers of different materials. Such inorganic film layers may be, for example, stacked alternately with film layers of organic material such as polyvinyl alcohol. The inorganic film preferably contains silicon nitride from the viewpoint of barrier properties and prevention of lifting of the first film described later during its production. Preferable methods for producing these inorganic film layers include the chemical vapor deposition (CVD) technique and the physical vapor deposition (PVD) technique.

By forming a first film on the inorganic film by the production method according to the present invention, it is possible to produce the aforementioned organic EL display substrate having a first film, an inorganic film, and a second film. The resin composition used for producing the first film is preferably the resin composition according to the present invention and, from the viewpoint of process simplification, the resin composition adopted is preferably the same as the resin composition to be used to produce the second film described previously.

An organic EL display device is then formed on the organic EL display substrate obtained above. For example, a TFT, which works as image driving device, a first electrode, an organic EL light emitting device, a second electrode, and sealing film are formed in this order.

A gas barrier film may be provided as required between the heat resistant resin film and the pixel driving device. The provision of a gas barrier film serves to prevent moisture, oxygen, or the like existing outside the organic EL display from passing through the heat resistant resin film to cause degradation of the pixel driving device, light emitting device, or the like. The gas barrier film may be of silicon oxide (SiOx), silicon nitride (SiNy), silicon oxynitride (SiOxNy), or the like, which may be in the form of a monolayer or a plurality of laminated inorganic layers of different materials. Methods for producing these gas barrier film layers include the chemical vapor deposition (CVD) technique and the physical vapor deposition (PVD) technique. To produce such gas barrier film, these inorganic film layers may be stacked alternately with film layers of organic material such as polyvinyl alcohol.

Finally, the heat resistant resin film is peeled from the support to provide an organic EL display containing the heat resistant resin film. The peeling along the interface between the support and the heat resistant resin film is carried out by such a technique as the use of a laser, mechanical peeling, etching of the support, or the like. When using a laser, the laser beam may be applied to the surface of the support, such as glass substrate, not carrying the image displaying device in order to carry out the peeling without causing damage to the image displaying device. To facilitate the peeling, furthermore, a primer layer may be provided between the support and the heat resistant resin film.

EXAMPLES

The present invention will be illustrated below in greater detail with reference to Examples, but it should be understood that the invention is not construed as being limited thereto.

(1) Measurement of Surface Tension of Solvent

The surface tension at 25° C. was measured by the ring method (using the Du Nouy surface tensiometer according to JIS-K-2241 (2000)).

(2) Measurement of Viscosity of Resin Composition

The viscosity at 25° C. was measured using a viscometer (TVE-22H, manufactured by Toki Sangyo Co., Ltd.).

(3) Percent Change in Viscosity of Resin Composition

The varnish prepared in each Synthesis example was stored at 23° C. for 60 days in Clean Bottle (manufactured by Aicello Chemical Co., Ltd.). The viscosity of the varnish was measured before and after the storage, and the percent change in viscosity was calculated by the equation given below.

Percent change in viscosity (%)=(viscosity after storage−viscosity before storage)/viscosity before storage×100

(4) Measurement of Molar Ratio Between Repeating Unit Represented by Chemical Formula (3) and Repeating Unit Represented by Chemical Formula (4) in Resin Composition Component For the resin prepared in each Polymerization example, the $^1$H-NMR spectrum was observed using a magnetic nuclear resonance apparatus (EX-270, manufactured by JEOL Ltd.). The varnish prepared in each Polymerization example was diluted with a deuterated solvent (deuterated dimethyl sulfoxide) to provide a specimen.

The integral value (denoted as a) of all $^1$H peaks contained in the diamine residue and tetracarboxylic acid residue contained in the resin composition component was determined. More specifically, the integral value of all peaks with chemical shifts (δ values) in the range of 6 to 9 ppm was determined. Then, the integral value of the $^1$H peak of the amide group in the resin was determined. More specifically, the integral value (denoted as ε) of all peaks with δ values in the range of 10 to 11 ppm was determined.

From the above values, the molar ratio between the repeating unit represented by chemical formula (3) and the repeating unit represented by chemical formula (4) in the resin composition component was calculated by the equation given below.

Molar ratio=ε:β−ε

Here, β=α/ω×2

(5) Esterification Rate of Resin Composition Component

Of the $R^4$ and $R^5$ groups in the repeating units represented by chemical formula (3) contained in a resin composition component, the proportion (represented in mole fraction) accounted for by the hydrocarbon groups containing 1 to 10 carbon atoms was defined as the esterification rate of the resin composition component and determined as follows.

For the resin prepared in each Polymerization example, the $^1$H-NMR spectrum was observed using a magnetic nuclear resonance apparatus (EX-270, manufactured by JEOL Ltd.). The varnish prepared in each Polymerization example was diluted with a deuterated solvent (deuterated dimethyl sulfoxide) to provide a specimen.

The integral value (denoted as ζ) of all $^1$H peaks contained in the diamine residue and tetracarboxylic acid residue contained in the resin composition component was determined. More specifically, the integral value of all peaks with chemical shifts (δ values) in the range of 6 to 9 ppm was determined. Then, the integral value of the $^1$H peak of the methyl group contained in the ester group in the resin composition component was determined. More specifically, the integral value (denoted as μ) of all peaks with δ values in the range of 3.5 to 4.0 ppm was determined.

From the above values, the esterification rate of the resin composition component was calculated by the equation given below.

Esterification rate=(μ/η)×100

Here, η=(ζ/θ)×ψ

(6) Production Quantity of Heat Resistant Resin or Precursor Thereof

For the varnish obtained in each Polymerization example, the production quantity of the heat resistant resin or precursor thereof was calculated by the equation given below.

Production quantity=G−(I×H×2×L/100)+((J−K)×H×2×(100−L)/100×M/100)

Here, G is the total mass of the dianhydride and diamine fed; H is the total number of moles of the dianhydride fed; I is the molecular weight of water; J is the molecular weight of the methyl group; K is the atomic weight of hydrogen; L=(1−ε/β)×100; and M=(μ/η)×100. The calculation was on the following assumption: H=18.02, J=15.03, and K=1.01.

For the varnish obtained in Polymerization example 8, however, the production quantity of the heat resistant resin or precursor thereof was calculated by the equation given below.

Production quantity=N−(P×O×2)

Here, N is the total mass of the BAHF, DEDC, and IPC fed; O is the total number of moles of the DEDC and IPC fed; and P is the molecular weight of hydrogen chloride. Here, the calculation was on the following assumption: P=36.46.

(7) Observation of Pinholes in Heat Resistant Resin Film

A heat resistant resin film specimen designed to have a film thickness of 10 μm after calcination was formed on a support substrate (length 350 mm×width 300 mm) and the number of pinholes formed was determined by visual observation and laser microscopy. It was rated as S when the number of pinholes formed was 0, rated as A when it was 1 or 2, rated as B when it was 3 to 10; and rated as C when it was 11 or more.

(8) Evaluation of Lifting of Heat Resistant Resin Film

Specimens of heat resistant resin film were prepared in such a manner that they would have a film thickness of 10 μm, 11 μm, 12 μm, 13 μm, 14 μm, or 15 μm after calcination. Each film specimen prepared was examined by visual observation for lifting of the film from the support, and the smallest film thickness where lifting occurred was defined as "smallest lifting thickness". In the case where film lifting did not occur even at 15 μm, the smallest lifting thickness was recorded as "more than 15 μm (15<)".

(9) Measurement of Film Thickness Range of Heat Resistant Resin Film

Figure 2:
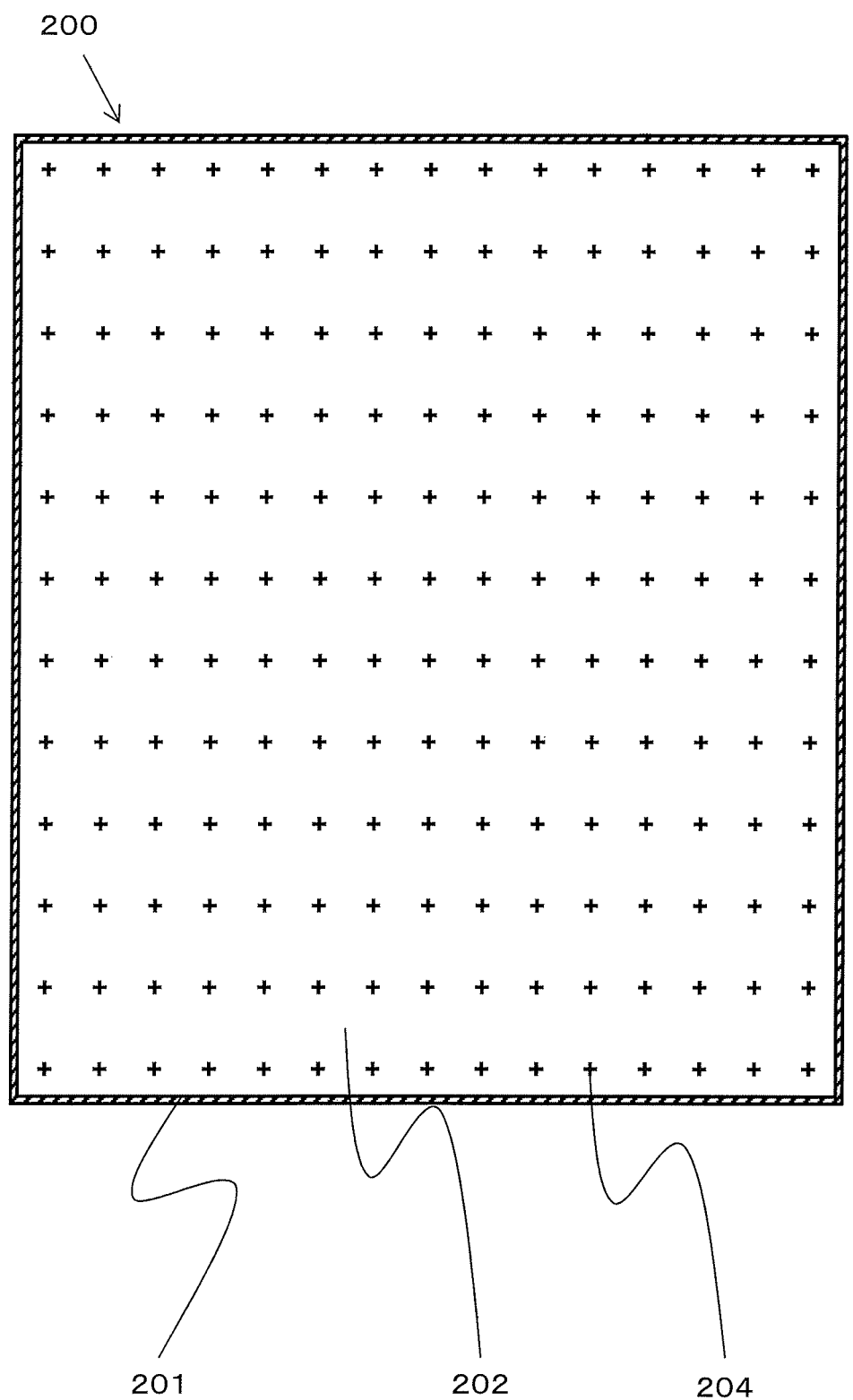
FIG. 2 is a typical measuring site for the thickness of a heat resistant resin film.

A heat resistant resin film specimen designed to have a film thickness of 10 μm after calcination was formed on a glass substrate (length 350 μm×width 300 μm). In the area excluding the 10 mm wide periphery along the edge of the heat resistant resin film specimen, the thickness of the heat resistant resin film was measured at a total of 180 positions located at equal intervals of 30 mm in the length direction and at equal intervals of 20 mm in the width direction as illustrated in FIG. 2 (denoted by "+") using a film thickness measuring apparatus (RE-8000, manufactured by SCREEN Finetech Solutions Co., Ltd.). From the film thickness measurements, the arithmetic mean film thickness was calculated and adopted as the average film thickness. Then, the film thickness range was calculated by the equation given below.

Film thickness range (%)=(maximum film thickness−minimum film thickness)/(average film thickness)×100

(10) Observation of Edge Shape of Heat Resistant Resin Film

Figure 3:
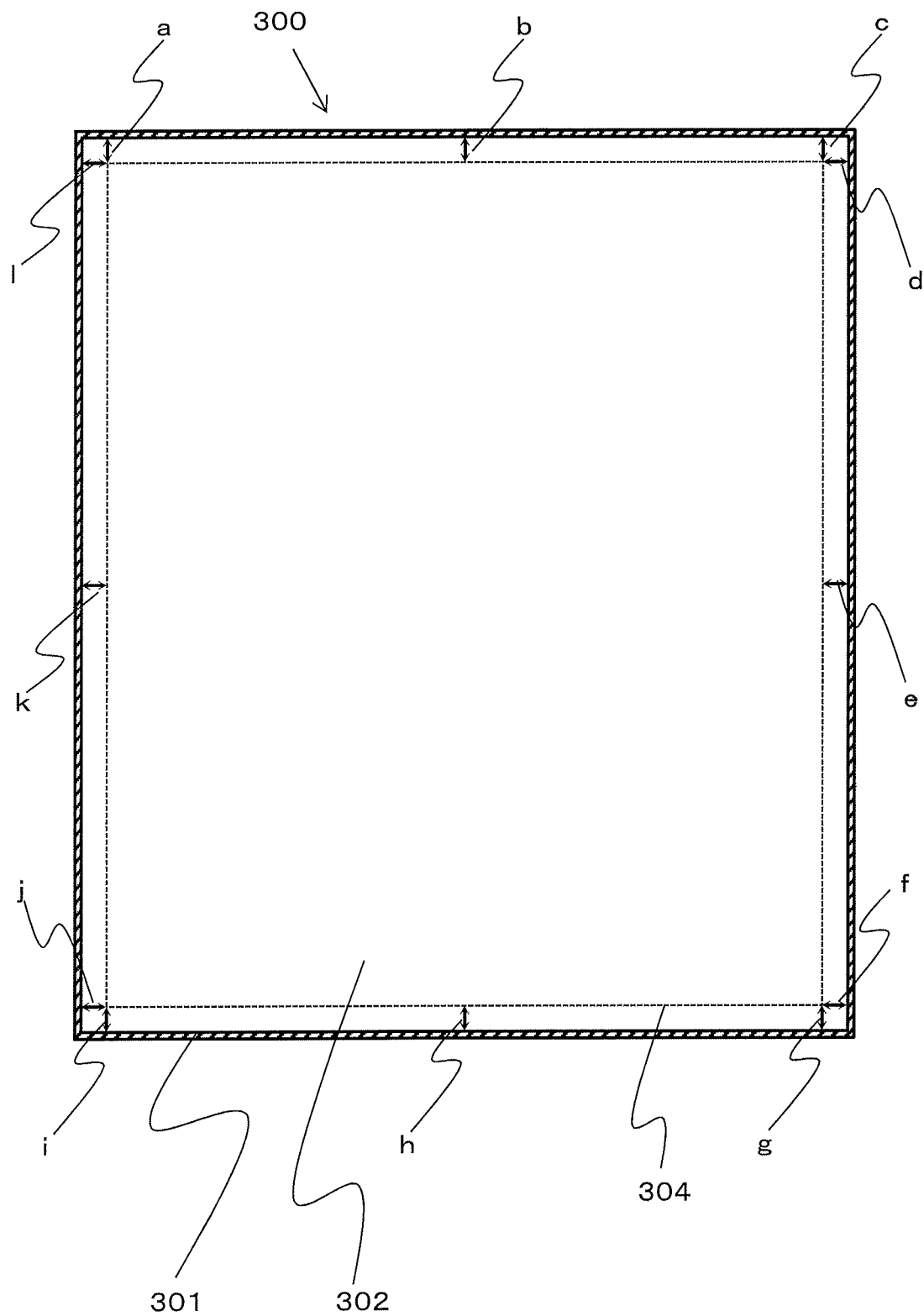
FIG. 3 is a typical measuring site for the end shape of a heat resistant resin film.

A heat resistant resin film specimen designed to have a film thickness of 10 μm after calcination was formed on a glass substrate and the film thickness was measured by a contour form measuring machine (SURFCOM 1900SD3, manufactured by Tokyo Seimitsu Co., Ltd.) at 12 positions (a) to (l) located within 10 mm from the edge near the slit coating start lines, as shown in FIG. 3. The swelling at edge was determined from the measurements by the equation given below.

Swelling at edge (%)=(maximum film thickness at edge−average film thickness)/(average film thickness)×100

The "average film thickness" referred to above is the same as the average film thickness defined in the paragraph "(9) Measurement of film thickness range of heat resistant resin film". In addition, the largest of the measurements of "peak film thickness at edge" taken at the 12 positions is adopted as the "maximum film thickness at edge" in the above equation. Here, the specimen was rated as "very good" when the swelling at edge was 5% or less, "good" when it was more than 5% and 10% or less, and "acceptable" when it was more than 10% and 15% or less. On the other hand, the specimen was rated as "unacceptable" when it was more than 15%.

(11) Evaluation of Peelability of Heat Resistant Resin Film

A heat resistant resin film specimen was formed on a glass substrate, which was then immersed in water, followed by peeling the film from the glass substrate by pulling it in water. The specimen was rated as "A" when peeling was performed smoothly and rated as "C" when peeling was not performed.

Listed below are abbreviations of the compounds used in Examples.

BPDA: 3,3',4,4'-biphenyl tetracarboxylic dianhydride
PMDA: pyromellitic dianhydride
ODPA: bis(3,4-dicarboxyphenyl) ether dianhydride
BSAA: 2,2-bis[4-(3,4-dicarboxyphenoxy)phenyl] propane dianhydride
DEDC: diphenyl ether dicarboxylic acid dichloride
IPC: isophthalic acid dichloride
PDA: p-phenylene diamine
CHDA: trans-1,4-cyclohexane diamine
HFHA: 2,2-bis[4-(4-aminophenoxy)phenyl] hexafluoropropane
SiDA: di(aminopropyidimethyl) siloxane
BAHF: bis(3-amino-4-hydroxyphenyl) hexafluoropropane
DMPA: N,N-dimethylpropione amide (surface tension 33.5 mN/m)
DEAC: N,N-diethylacetamide (surface tension 31.6 mN/m)
DMIB: N,N-dimethyl isobutyl amide (surface tension 31.0 mN/m)
DMAC: N,N-dimethyl acetamide (surface tension 35.6 mN/m)
NMP: N-methyl-2-pyrolidone (surface tension 40.9 mN/m)
SI-1: 3-ureidopropyl triethoxysilane (boiling point more than 300° C.)
SI-2: 3-glycidoxypropyl trimethoxysilane (boiling point 290° C.)
SI-3: 2-(3,4-epoxycyclohexyl) ethyl trimethoxysilane (boiling point 310° C.)
SI-4: N-phenyl-3-aminopropyl trimethoxysilane (boiling point 312° C.)
SI-5: X-12-981 (manufactured by Shin-Etsu Chemical Co., Ltd.) (boiling point more than 300° C.)
SI-6: 3-glycidoxypropylmethyl diethoxysilane (boiling point 259° C.)
SI-7: 3-isocyanate propyl triethoxysilane (boiling point 250° C.)
SI-8: 3-aminopropyl trimethoxysilane (boiling point 215° C.)
SI-9: N-2-(aminoethyl)-3-aminopropyl methyl dimethoxysilane (boiling point 234° C.)
SI-10: vinyl trimethoxysilane (boiling point 123° C.)

Here, SI-1 to SI-10 are all compounds as represented by chemical formula (2) and contain at least one selected from the following: vinyl group, epoxy group, styryl group, methacryl group, acrylic group, amino group, ureido group, mercapto group, sulfide group, and isocyanate group.

Polymerization Example 1

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 8.19 g (75.7 mmol) of PDA was added and washing was performed with 20 g of DMIB. After confirming the dissolution of PDA, 21.82 g (74.2 mmol) of BPDA was added and washing was performed with 20 g of DMIB. After stirring for 4 hours, 10 g of molecular sieve 4 A was added, followed by heating to 90° C. and stirring for 6 hours. The reaction solution was cooled to room temperature to provide a varnish.

Polymerization Example 2

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 8.19 g (75.7 mmol) of PDA was added and washing was performed with 20 g of DMIB. After confirming the dissolution of PDA, 21.82 g (74.2 mmol) of BPDA was added and washing was performed with 20 g of DMIB. After stirring for 4 hours and then cooling to 40° C., 20.16 g (151.3 mmol) of dimethylacetamide dimethylacetal was added, followed by stirring for 2 hours. The reaction solution was cooled to room temperature to provide a varnish.

Polymerization Example 3

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 9.21 g (85.1 mmol) of PDA was added and washing was performed with 20 g of DMIB. After confirming the dissolution of PDA, 10.02 g (34.1 mmol) of BPDA and 10.77 g (49.4 mmol) of PMDA were added and washing was performed with 20 g of DMIB. After stirring for 4 hours, 10 g of molecular sieve 4 A was added, followed by heating to 90° C. and stirring for 6 hours. The reaction solution was cooled to room temperature to provide a varnish.

Polymerization Example 4

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 7.87 g (72.8 mmol) of PDA was added and washing was performed with 20 g of DMIB. After confirming the dissolution of PDA, 22.13 g (71.3 mmol) of ODPA was added and washing was performed with 20 g of DMIB. After stirring for 4 hours, 10 g of molecular sieve 4 A was added, followed by heating to 90° C. and stirring for 6 hours. The reaction solution was cooled to room temperature to provide a varnish.

Polymerization Example 5

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 20.31 g (33.6 mmol) of HFHA was added and washing was performed with 20 g of DMIB. After confirming the dissolution of HFHA, 9.69 g (32.9 mmol) of BPDA was added and washing was performed with 20 g of DMIB. After stirring for 4 hours, 10 g of molecular sieve 4 A was added, followed by heating to 90° C. and stirring for 6 hours. The reaction solution was cooled to room temperature to provide a varnish.

Polymerization Example 6

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 8.14 g (71.3 mmol) of CHDA was added and washing was performed with 20 g of DMIB. After confirming the dissolution of CHDA, 18.89 g (64.2 mmol) of BPDA and 2.97 g (5.7 mmol) of BSAA were added and washing was performed with 20 g of DMIB. After stirring for 4 hours, 10 g of molecular sieve 4 A was added, followed by heating to 90° C. and stirring for 6 hours. The reaction solution was cooled to room temperature to provide a varnish.

Polymerization Example 7

A thermometer and a stirring rod equipped with stirring blades were fitted on a 300 mL four-necked flask. Then, 130 g of DMIB was fed under a dry nitrogen flow, and the temperature was elevated to 60° C. After the temperature elevation, while stirring is continued, 19.34 g (32.0 mmol) of HFHA and 0.42 g (1.7 mmol) of SiDA were added and washing was performed with 20 g of DMIB. After confirming the dissolution of HFHA and SiDA, 10.24 g (33.0 mmol) of ODPA was added and washing was performed with 20 g of DMIB. After stirring for 4 hours, 10 g of molecular sieve 4 A was added, followed by heating to 90° C. and stirring for 6 hours. The reaction solution was cooled to room temperature to provide a varnish.

Polymerization Example 8

A thermometer, a stirring rod equipped with stirring blades, and a dropping funnel were fitted on a 300 mL four-necked flask. Under a dry nitrogen flow, 18.00 g (49.2 mol) of BAHF was dissolved in 150 g of DMIB, and the solution was cooled to a temperature of −15° C. To this, a solution prepared by dissolving 7.11 g (24.1 mmol) of DEDC and 4.89 g (24.1 mmol) of IPC in 50 g of DMIB was dropped while preventing the inner temperature from exceeding 0° C. After the completion of the dropping step, stirring was continued at −15° C. for 6 hours. The reaction solution was warmed to room temperature to provide a varnish.

Polymerization Example 9

Except for using DMPA instead of DMIB, the same procedure as in Polymerization example 1 was carried out to produce a varnish.

Polymerization Example 10

Except for using DEAC instead of DMIB, the same procedure as in Polymerization example 1 was carried out to produce a varnish.

Polymerization Example 11

Except for carrying out the step of heating to 100° C. and stirring for 10 hours instead of the step of heating to 90° C. and stirring for 6 hours, the same procedure as in Polymerization example 1 was carried out to produce a varnish.

Polymerization Example 12

Except for carrying out the step of heating to 90° C. and stirring for 4 hours instead of the step of heating to 90° C. and stirring for 6 hours, the same procedure as in Polymerization example 1 was carried out to produce a varnish.

Polymerization Example 13

Except for using DMPA instead of DMIB, the same procedure as in Polymerization example 11 was carried out to produce a varnish.

Polymerization Example 14

Except for using DMPA instead of DMIB and carrying out the step of heating to 110° C. and stirring for 10 hours instead of the step of heating to 90° C. and stirring for 6 hours, the same procedure as in Polymerization example 1 was carried out to produce a varnish.

Polymerization Example 15

Except for using DMPA instead of DMIB and adding 23.68 g (177.8 mmol) of dimethylacetamide dimethylacetal, the same procedure as in Polymerization example 2 was carried out to produce a varnish.

Polymerization Example 16

Except for using DMPA instead of DMIB, the same procedure as in Polymerization example 12 was carried out to produce a varnish.

Polymerization Example 17

Except for using DMPA instead of DMIB and carrying out the step of heating to 80° C. and stirring for 4 hours instead of the step of heating to 90° C. and stirring for 6 hours, the same procedure as in Polymerization example 1 was carried out to produce a varnish.

Polymerization Example 18

Except for using DMPA instead of DMIB and adding 11.09 g (83.2 mmol) of dimethylacetamide dimethylacetal, the same procedure as in Polymerization example 2 was carried out to produce a varnish.

Polymerization Example 19

Except for using DMPA instead of DMIB and omitting the step of adding 10 g of molecular sieve 4 A, heating to 90° C., and stirring for 6 hours, the same procedure as in Polymerization example 1 was carried out to produce a varnish.

Polymerization Example 20

Except for using DMIB instead of DMPA, the same procedure as in Polymerization example 19 was carried out to produce a varnish.

Polymerization Example 21

Except for using NMP instead of DMIB, the same procedure as in Polymerization example 1 was carried out to produce a varnish.

Polymerization Example 22

Except for using NMP instead of DMPA, the same procedure as in Polymerization example 14 was carried out to produce a varnish.

Polymerization Example 23

Except for using NMP instead of DMPA, the same procedure as in Polymerization example 15 was carried out to produce a varnish.

Polymerization Example 24

Except for using NMP instead of DMPA, the same procedure as in Polymerization example 17 was carried out to produce a varnish.

Polymerization Example 25

Except for using NMP instead of DMPA, the same procedure as in Polymerization example 18 was carried out to produce a varnish.

Polymerization Example 26

Except for using NMP instead of DMPA, the same procedure as in Polymerization example 19 was carried out to produce a varnish.

Polymerization Example 27

Except for using DMAc instead of DMIB, the same procedure as in Polymerization example 1 was carried out to produce a varnish.

For the varnish samples obtained in Polymerization examples 1 to 27, the molar ratio between the repeating unit represented by chemical formula (3) and the repeating unit represented by chemical formula (4) in the resin composition component and the esterification rate of the resin composition component were determined and the production quantity of the heat resistant resin or precursor thereof was calculated.

Synthesis Example 1

A 0.15 g portion (corresponding to 0.5 parts by mass relative to 100 parts by mass of the heat resistant resin or precursor thereof) of the silane compound SI-1 is added to the varnish obtained in Polymerization example 1, which was then diluted with DMIB to adjust the viscosity to about 2000 cP, followed by filtration through a filter with a pore size of 0.2 μm to provide a varnish.

Synthesis Examples 2 to 40

By changing the Polymerization example, silane compound to be added, and its quantity according to Table 1, different varnish samples were produced by the same procedure as in Synthesis example 1.

Table 1 shows features for Polymerization examples 1 to 27 and Synthesis examples 1 to 40.

TABLE 1

| Synthesis example | Polymerization example | Solvent | Amine component (molar ratio) | Acid component (molar ratio) | Ratio between repeating units of formulae (3) and (4) | Esterification rate (%) | Production quality of heat resistant resin or precursor thereof (g) | Silane compound type | boiling point (° C.) | quantity (parts by mass*) |
|---|---|---|---|---|---|---|---|---|---|---|
| Synthesis example 1 | Polymerization example 1 | DMIB | PDA(100) | BPDA(98) | 86:14 | 0 | 29.6 | SI-1 | 300< | 0.5 |
| Synthesis example 2 | Polymerization example 2 | DMIB | PDA(100) | BPDA(98) | 100:0 | 80 | 31.7 | SI-1 | 300< | 0.5 |

TABLE 1-continued

| Synthesis example | Polymerization example | Solvent | Amine component (molar ratio) | Acid component (molar ratio) | Ratio between repeating units of formulae (3) and (4) | Esterification rate (%) | Production quality of heat resistant resin or precursor thereof (g) | Silane compound type | boiling point (° C.) | quantity (parts by mass*) |
|---|---|---|---|---|---|---|---|---|---|---|
| Synthesis example 3 | Polymerization example 3 | DMIB | PDA(100) | PMDA(58)/BPDA(40) | 86:14 | 0 | 29.6 | SI-1 | 300< | 0.5 |
| Synthesis example 4 | Polymerization example 4 | DMIB | PDA(100) | ODPA(98) | 86:14 | 0 | 29.6 | SI-1 | 300< | 0.5 |
| Synthesis example 5 | Polymerization example 5 | DMIB | HFHA(100) | BPDA(98) | 86:14 | 0 | 29.8 | SI-1 | 300< | 0.5 |
| Synthesis example 6 | Polymerization example 6 | DMIB | CHDA(100) | BPDA(90)/BSAA(8) | 86:14 | 0 | 29.6 | SI-1 | 300< | 0.5 |
| Synthesis example 7 | Polymerization example 7 | DMIB | HFHA(95)/SiDA(5) | ODPA(98) | 86:14 | 0 | 29.8 | SI-1 | 300< | 0.5 |
| Synthesis example 8 | Polymerization example 8 | DMIB | BAHF(100) | DEDC(49)/IPC(49) | — | — | 26.5 | SI-1 | 300< | 0.5 |
| Synthesis example 9 | Polymerization example 9 | DMPA | PDA(100) | BPDA(98) | 86:14 | 0 | 29.6 | SI-1 | 300< | 0.5 |
| Synthesis example 10 | Polymerization example 10 | DEAC | PDA(100) | BPDA(98) | 86:14 | 0 | 29.6 | SI-1 | 300< | 0.5 |
| Synthesis example 11 | Polymerization example 11 | DMIB | PDA(100) | BPDA(98) | 76:24 | 0 | 29.4 | SI-1 | 300< | 0.5 |
| Synthesis example 12 | Polymerization example 12 | DMIB | PDA(100) | BPDA(98) | 94:6 | 0 | 29.8 | SI-1 | 300< | 0.5 |
| Synthesis example 13 | Polymerization example 13 | DMPA | PDA(100) | BPDA(98) | 76:24 | 0 | 29.4 | SI-1 | 300< | 0.5 |
| Synthesis example 14 | Polymerization example 14 | DMPA | PDA(100) | BPDA(98) | 70:30 | 0 | 29.2 | SI-1 | 300< | 0.5 |
| Synthesis example 15 | Polymerization example 15 | DMPA | PDA(100) | BPDA(98) | 100:0 | 97 | 32.0 | SI-1 | 300< | 0.5 |
| Synthesis example 16 | Polymerization example 16 | DMPA | PDA(100) | BPDA(98) | 94:6 | 0 | 29.8 | SI-1 | 300< | 0.5 |
| Synthesis example 17 | Polymerization example 17 | DMPA | PDA(100) | BPDA(98) | 98:2 | 0 | 29.9 | SI-1 | 300< | 0.5 |
| Synthesis example 18 | Polymerization example 18 | DMPA | PDA(100) | BPDA(98) | 100:0 | 45 | 30.9 | SI-1 | 300< | 0.5 |
| Synthesis example 19 | Polymerization example 19 | DMPA | PDA(100) | BPDA(98) | 100:0 | 0 | 30.0 | SI-1 | 300< | 0.5 |
| Synthesis example 20 | Polymerization example 1 | DMIB | PDA(100) | BPDA(98) | 86:14 | 0 | 29.6 | SI-2 | 290 | 0.5 |
| Synthesis example 21 | Polymerization example 1 | DMIB | PDA(100) | BPDA(98) | 86:14 | 0 | 29.6 | SI-3 | 310 | 0.5 |
| Synthesis example 22 | Polymerization example 1 | DMIB | PDA(100) | BPDA(98) | 86:14 | 0 | 29.6 | SI-4 | 312 | 0.5 |
| Synthesis example 23 | Polymerization example 1 | DMIB | PDA(100) | BPDA(98) | 86:14 | 0 | 29.6 | SI-5 | 300< | 0.5 |
| Synthesis example 24 | Polymerization example 1 | DMIB | PDA(100) | BPDA(98) | 86:14 | 0 | 29.6 | SI-6 | 259 | 0.5 |
| Synthesis example 25 | Polymerization example 1 | DMIB | PDA(100) | BPDA(98) | 86:14 | 0 | 29.6 | SI-7 | 250 | 0.5 |
| Synthesis example 26 | Polymerization example 1 | DMIB | PDA(100) | BPDA(98) | 86:14 | 0 | 29.6 | SI-1 | 300< | 4.5 |
| Synthesis example 27 | Polymerization example 1 | DMIB | PDA(100) | BPDA(98) | 86:14 | 0 | 29.6 | SI-1 | 300< | 0.003 |
| Synthesis example 28 | Polymerization example 1 | DMIB | PDA(100) | BPDA(98) | 86:14 | 0 | 29.6 | SI-8 | 215 | 0.5 |
| Synthesis example 29 | Polymerization example 1 | DMIB | PDA(100) | BPDA(98) | 86:14 | 0 | 29.6 | SI-9 | 234 | 0.5 |
| Synthesis example 30 | Polymerization example 1 | DMIB | PDA(100) | BPDA(98) | 86:14 | 0 | 29.6 | SI-10 | 123 | 0.5 |
| Synthesis example 31 | Polymerization example 1 | DMIB | PDA(100) | BPDA(98) | 86:14 | 0 | 29.6 | — | — | 0 |
| Synthesis example 32 | Polymerization example 20 | DMIB | PDA(100) | BPDA(98) | 100:0 | 0 | 30.0 | — | — | 0 |
| Synthesis example 33 | Polymerization example 21 | NMP | PDA(100) | BPDA(98) | 86:14 | 0 | 29.6 | SI-1 | 300< | 0.5 |
| Synthesis example 34 | Polymerization example 22 | NMP | PDA(100) | BPDA(98) | 70:30 | 0 | 29.2 | SI-1 | 300< | 0.5 |
| Synthesis example 35 | Polymerization example 23 | NMP | PDA(100) | BPDA(98) | 100:0 | 97 | 32.0 | SI-1 | 300< | 0.5 |
| Synthesis example 36 | Polymerization example 24 | NMP | PDA(100) | BPDA(98) | 98:2 | 0 | 29.9 | SI-1 | 300< | 0.5 |
| Synthesis example 37 | Polymerization example 25 | NMP | PDA(100) | BPDA(98) | 100:0 | 45 | 30.9 | SI-1 | 300< | 0.5 |
| Synthesis example 38 | Polymerization example 26 | NMP | PDA(100) | BPDA(98) | 100:0 | 0 | 30.0 | SI-1 | 300< | 0.5 |

TABLE 1-continued

| Synthesis example | Polymerization example | Solvent | Amine component (molar ratio) | Acid component (molar ratio) | Ratio between repeating units of formulae (3) and (4) | Esterification rate (%) | Production quality of heat resistant resin or precursor thereof (g) | Silane compound type | boiling point (° C.) | quantity (parts by mass*) |
|---|---|---|---|---|---|---|---|---|---|---|
| Synthesis example 39 | Polymerization example 21 | NMP | PDA(100) | BPDA(98) | 86:14 | 0 | 29.6 | — | — | 0 |
| Synthesis example 40 | Polymerization example 27 | DMAc | PDA(100) | BPDA(98) | 86:14 | 0 | 29.6 | SI-1 | 300< | 0.5 |

*relative to 100 parts by mass of heat resistant resin or precursor thereof

Example 1

Using a slit coating apparatus (manufactured by Toray Engineering Co., Ltd.), the varnish prepared in Synthesis example 1 was spread on a 5 mm wide periphery along the edge of a non-alkali glass substrate (AN-100, manufactured by Asahi Glass Co., Ltd.) having a size of length 350 mm×width 300 mm×thickness 0.5 mm. Then, heating and vacuum-drying was performed at a temperature of 40° C. in the same apparatus. Finally, using a gas oven (INH-21CD, manufactured by Koyo Thermo Systems Co., Ltd.), heating was performed at 500° C. for 30 minutes in a nitrogen atmosphere (oxygen concentration 100 ppm or less) to form a heat resistant resin film on the glass substrate. Evaluation of the resulting heat resistant resin film was performed for pinholes, film lifting, edge swelling, film thickness range, and peelability.

Examples 2 to 32 and Comparative Examples 1 to 8

The same evaluation as in Example 1 was performed for the varnish samples prepared in Synthesis examples 2 to 40 as described in Table 2. It should be noted, however, that heating was performed at 400° C. for 30 minutes in Example 4 instead of 500° C. for 30 minutes, and at 300° C. for 30 minutes in Examples 5 to 8 instead of 500° C. for 30 minutes.

Evaluation results of the heat resistant resin film samples obtained in Examples 1 to 32 and Comparative examples 1 and 8 are shown in Table 2.

TABLE 2

| | | Viscosity | | | | | Smallest | | | Film | |
| | | before storage | after storage | rate of change | Pinhole evaluation | | lifting thickness | Swelling at edge | | thickness range | |
| Example | Varnish | (cP) | (cP) | (%) | number | rating | (μm) | (%) | rating | (%) | Peelability |
|---|---|---|---|---|---|---|---|---|---|---|---|
| Example 1 | Synthesis example 1 | 1998 | 1962 | −1.8 | 0 | S | 15< | 4.2 | very good | 4.8 | A |
| Example 2 | Synthesis example 2 | 2008 | 1980 | −1.4 | 0 | S | 15< | 4.1 | very good | 5.5 | A |
| Example 3 | Synthesis example 3 | 1996 | 1970 | −1.3 | 0 | S | 15< | 4.0 | very good | 4.9 | A |
| Example 4 | Synthesis example 4 | 1999 | 1959 | −2.0 | 0 | S | 15< | 4.2 | very good | 5.3 | A |
| Example 5 | Synthesis example 5 | 2000 | 1944 | −2.8 | 0 | S | 15< | 4.8 | very good | 5.2 | A |
| Example 6 | Synthesis example 6 | 2006 | 1942 | −3.2 | 0 | S | 15< | 4.7 | very good | 5.5 | A |
| Example 7 | Synthesis example 7 | 2002 | 1940 | −3.1 | 0 | S | 15< | 4.6 | very good | 5.7 | A |
| Example 8 | Synthesis example 8 | 1990 | 1948 | −2.1 | 0 | S | 15< | 4.9 | very good | 5.8 | A |
| Example 9 | Synthesis example 9 | 1995 | 1897 | −4.9 | 0 | S | 15< | 7.9 | good | 5.2 | A |
| Example 10 | Synthesis example 10 | 2003 | 1959 | −2.2 | 0 | S | 15< | 6.3 | good | 5.1 | A |
| Example 11 | Synthesis example 11 | 1998 | 1978 | −1.0 | 0 | S | 15< | 4.0 | very good | 5.8 | A |
| Example 12 | Synthesis example 12 | 2009 | 1951 | −2.9 | 0 | S | 15< | 4.9 | very good | 4.4 | A |
| Example 13 | Synthesis example 13 | 2001 | 1921 | −4.0 | 0 | S | 15< | 8.8 | good | 8.8 | A |
| Example 14 | Synthesis example 14 | 1992 | 1934 | −2.9 | 0 | S | 15< | 6.0 | good | 13.3 | A |
| Example 15 | Synthesis example 15 | 1995 | 1937 | −2.9 | 0 | S | 15< | 6.2 | good | 13.8 | A |
| Example 16 | Synthesis example 16 | 2005 | 1817 | −9.4 | 0 | S | 15< | 13.2 | acceptable | 5.2 | A |
| Example 17 | Synthesis example 17 | 2009 | 1744 | −13.2 | 0 | S | 15< | 18.6 | unacceptable | 5.1 | A |
| Example 18 | Synthesis example 18 | 1996 | 1721 | −13.8 | 0 | S | 15< | 17.2 | unacceptable | 5.2 | A |
| Example 19 | Synthesis example 19 | 1999 | 1717 | −14.1 | 0 | S | 15< | 19.1 | unacceptable | 5.4 | A |
| Example 20 | Synthesis example 20 | 2000 | 1966 | −1.7 | 0 | S | 15< | 4.0 | very good | 4.1 | A |
| Example 21 | Synthesis example 21 | 1998 | 1962 | −1.8 | 0 | S | 15< | 4.1 | very good | 4.4 | A |
| Example 22 | Synthesis example 22 | 2003 | 1963 | −2.0 | 0 | S | 15< | 4.0 | very good | 4.0 | A |
| Example 23 | Synthesis example 23 | 2010 | 1972 | −1.9 | 0 | S | 15< | 4.3 | very good | 4.3 | A |
| Example 24 | Synthesis example 24 | 2001 | 1965 | −1.8 | 0 | S | 15< | 4.2 | very good | 4.6 | A |
| Example 25 | Synthesis example 25 | 1999 | 1965 | −1.7 | 0 | S | 15< | 4.0 | very good | 4.1 | A |
| Example 26 | Synthesis example 26 | 1994 | 1954 | −2.0 | 0 | S | 15< | 4.1 | very good | 4.4 | C |
| Example 27 | Synthesis example 27 | 2007 | 1969 | −1.9 | 0 | S | 12 | 4.2 | very good | 4.0 | A |
| Example 28 | Synthesis example 28 | 1998 | 1962 | −1.8 | 0 | S | 10> | 4.0 | very good | 4.5 | A |
| Example 29 | Synthesis example 29 | 2004 | 1966 | −1.9 | 0 | S | 10> | 4.4 | very good | 4.1 | A |
| Example 30 | Synthesis example 30 | 1992 | 1958 | −1.7 | 0 | S | 10> | 4.1 | very good | 4.0 | A |

TABLE 2-continued

| Example | Varnish | Viscosity before storage (cP) | Viscosity after storage (cP) | rate of change (%) | Pinhole evaluation number | Pinhole evaluation rating | Smallest lifting thickness (μm) | Swelling at edge (%) | Swelling at edge rating | Film thickness range (%) | Peelability |
|---|---|---|---|---|---|---|---|---|---|---|---|
| Example 31 | Synthesis example 31 | 2008 | 1974 | −1.7 | 0 | S | 10> | 4.2 | very good | 4.1 | A |
| Example 32 | Synthesis example 32 | 2002 | 1732 | −13.5 | 0 | S | 10> | 17.0 | unacceptable | 5.1 | A |
| Comparative example 1 | Synthesis example 33 | 2003 | 1841 | −8.1 | 12 | C | 15< | 23.2 | unacceptable | 7.4 | C |
| Comparative example 2 | Synthesis example 34 | 2001 | 1901 | −5.0 | 16 | C | 15< | 20.1 | unacceptable | 10.0 | C |
| Comparative example 3 | Synthesis example 35 | 1999 | 1877 | −6.1 | 15 | C | 15< | 20.2 | unacceptable | 10.5 | C |
| Comparative example 4 | Synthesis example 36 | 1995 | 1694 | −15.1 | 17 | C | 15< | 26.8 | unacceptable | 5.0 | C |
| Comparative example 5 | Synthesis example 37 | 2009 | 1671 | −16.8 | 19 | C | 15< | 25.6 | unacceptable | 4.9 | C |
| Comparative example 6 | Synthesis example 38 | 2001 | 1627 | −18.7 | 18 | C | 15< | 27.9 | unacceptable | 4.9 | C |
| Comparative example 7 | Synthesis example 39 | 1995 | 1833 | −8.1 | 12 | C | 15< | 23.1 | unacceptable | 9.1 | A |
| Comparative example 8 | Synthesis example 40 | 2001 | 1855 | −7.3 | 13 | C | 15< | 18.8 | unacceptable | 7.9 | C |

Example 33

On the heat resistant resin film prepared in Example 1 (serving as the second film), an inorganic film containing $Si_3N_4$ was formed by CVD. On this inorganic film, a heat resistant resin film (serving as the first film) was formed by the same procedure as in Example 1 using the varnish prepared in Synthesis example 1. The resulting heat resistant resin film was subjected to evaluation for pinholes and film lifting. Similar evaluations were made for films containing $SiO_2$ instead of $Si_3N_4$.

Examples 34 to 64 and Comparative Examples 9 to 16

Similar evaluations similar to those in Example 33 were made except that the film samples prepared in Example 1 to 32 and Comparative example 1 to 8 were adopted as the second film and that the varnish samples prepared in Synthesis examples 1 to 40 were adopted as the varnish material for producing the first film as shown in Table 3. It should be noted, however, that heating was performed at 400° C. for 30 minutes in Example 36 instead of 500° C. for 30 minutes, and at 300° C. for 30 minutes in Examples 37 to 40 instead of 500° C. for 30 minutes.

Evaluation results obtained in Examples 33 to 64 and Comparative examples 9 to 16 are shown in Table 3.

TABLE 3

| Example | Second film | Varnish for first film production | On $Si_3N_4$ inorganic film pinhole evaluation number | On $Si_3N_4$ inorganic film pinhole evaluation rating | On $Si_3N_4$ inorganic film smallest lifting thickness (μm) | On $SiO_2$ inorganic film pinhole evaluation number | On $SiO_2$ inorganic film pinhole evaluation rating | On $SiO_2$ inorganic film smallest lifting thickness (μm) |
|---|---|---|---|---|---|---|---|---|
| Example 33 | Example 1 | Synthesis example 1 | 0 | S | 15< | 0 | S | 13 |
| Example 34 | Example 2 | Synthesis example 2 | 0 | S | 15< | 0 | S | 13 |
| Example 35 | Example 3 | Synthesis example 3 | 0 | S | 15< | 0 | S | 13 |
| Example 36 | Example 4 | Synthesis example 4 | 0 | S | 15< | 0 | S | 13 |
| Example 37 | Example 5 | Synthesis example 5 | 0 | S | 15< | 0 | S | 12 |
| Example 38 | Example 6 | Synthesis example 6 | 0 | S | 15< | 0 | S | 13 |
| Example 39 | Example 7 | Synthesis example 7 | 0 | S | 15< | 0 | S | 13 |
| Example 40 | Example 8 | Synthesis example 8 | 0 | S | 15< | 0 | S | 12 |
| Example 41 | Example 9 | Synthesis example 9 | 1 | A | 15< | 1 | A | 13 |
| Example 42 | Example 10 | Synthesis example 10 | 1 | A | 15< | 1 | A | 12 |
| Example 43 | Example 11 | Synthesis example 11 | 0 | S | 15< | 0 | S | 12 |
| Example 44 | Example 12 | Synthesis example 12 | 0 | S | 15< | 0 | S | 13 |
| Example 45 | Example 13 | Synthesis example 13 | 1 | A | 15< | 2 | A | 13 |
| Example 46 | Example 14 | Synthesis example 14 | 1 | A | 15< | 2 | A | 13 |
| Example 47 | Example 15 | Synthesis example 15 | 1 | A | 15< | 2 | A | 12 |
| Example 48 | Example 16 | Synthesis example 16 | 1 | A | 15< | 2 | A | 13 |
| Example 49 | Example 17 | Synthesis example 17 | 1 | A | 15< | 3 | B | 12 |
| Example 50 | Example 18 | Synthesis example 18 | 1 | A | 15< | 3 | B | 13 |
| Example 51 | Example 19 | Synthesis example 19 | 1 | A | 15< | 4 | B | 13 |
| Example 52 | Example 20 | Synthesis example 20 | 0 | S | 11 | 0 | S | 13 |
| Example 53 | Example 21 | Synthesis example 21 | 0 | S | 12 | 0 | S | 13 |
| Example 54 | Example 22 | Synthesis example 22 | 0 | S | 12 | 0 | S | 13 |
| Example 55 | Example 23 | Synthesis example 23 | 0 | S | 12 | 0 | S | 12 |

TABLE 3-continued

| Example | Varnish for Second film | Varnish for first film production | On Si$_3$N$_4$ inorganic film pinhole evaluation number | rating | smallest lifting thickness (μm) | On SiO$_2$ inorganic film pinhole evaluation number | rating | smallest lifting thickness (μm) |
|---|---|---|---|---|---|---|---|---|
| Example 56 | Example 24 | Synthesis example 24 | 0 | S | 11 | 0 | S | 13 |
| Example 57 | Example 25 | Synthesis example 25 | 0 | S | 11 | 0 | S | 12 |
| Example 58 | Example 26 | Synthesis example 26 | 0 | S | 15< | 0 | S | 13 |
| Example 59 | Example 27 | Synthesis example 27 | 0 | S | 13 | 0 | S | 10> |
| Example 60 | Example 28 | Synthesis example 28 | 0 | S | 10> | 0 | S | 10> |
| Example 61 | Example 29 | Synthesis example 29 | 0 | S | 10> | 0 | S | 10> |
| Example 62 | Example 30 | Synthesis example 30 | 0 | S | 10> | 0 | S | 10> |
| Example 63 | Example 31 | Synthesis example 31 | 0 | S | 10> | 0 | S | 10> |
| Example 64 | Example 32 | Synthesis example 32 | 0 | S | 10> | 0 | S | 10> |
| Comparative example 9 | Comparative example 1 | Synthesis example 33 | 15 | C | 15< | 16 | C | 15< |
| Comparative example 10 | Comparative example 2 | Synthesis example 34 | 17 | C | 15< | 16 | C | 15< |
| Comparative example 11 | Comparative example 3 | Synthesis example 35 | 19 | C | 15< | 18 | C | 15< |
| Comparative example 12 | Comparative example 4 | Synthesis example 36 | 21 | C | 15< | 19 | C | 15< |
| Comparative example 13 | Comparative example 5 | Synthesis example 37 | 20 | C | 15< | 18 | C | 15< |
| Comparative example 14 | Comparative example 6 | Synthesis example 38 | 20 | C | 15< | 19 | C | 15< |
| Comparative example 15 | Comparative example 7 | Synthesis example 39 | 17 | C | 15< | 18 | C | 15< |
| Comparative example 16 | Comparative example 8 | Synthesis example 40 | 18 | C | 15< | 17 | C | 15< |

Example 65

On top of the heat resistant resin film with a film thickness of 15 μm existing on the Si$_3$N$_4$-based inorganic film or SiO$_2$-based inorganic film prepared in Example 33, a TFT was produced and a Si$_3$N$_4$-based insulation film was then formed in such a manner as to cover this TFT. Then, a contact hole was produced in this insulation film and wiring connecting to the TFT through this contact hole was formed.

In addition, a planarizing film was formed to planarize the irregularities formed by the wiring. Then, on top of the resulting planarizing film, an ITO-based first electrode connecting to the wiring was formed. Then, the surface was coated with a resist, prebaked, exposed to light through an appropriately patterned mask, and developed. Using this resist pattern as mask, patterning was performed by wet etching with an ITO etchant. Subsequently, the resist patter was removed using a resist stripping liquid (a liquid mixture of monoethanol amine and diethylene glycol monobutyl ether). After the removal step, the substrate was rinsed and heated for dehydration to provide an electrode substrate having a planarizing film. Next, an insulation film was formed in a shape that covers the periphery of the first electrode.

In addition, in a vacuum deposition apparatus, a positive hole transport layer, organic luminescent layer, and electron transport layer were deposited in this order through appropriate pattern masks. Subsequently, the second electrode of Al/Mg was formed over the entire surface above the substrate. In addition, a sealing film in the form of stacked layers of SiO$_2$ and Si$_3$N$_4$ was formed by CVD. Finally, laser (wavelength 308 nm) was applied to that surface of the glass substrate which does not have a heat resistant resin film and peeling was carried out along the interface with the heat resistant resin film.

In this way, an organic EL display device having a heat resistant resin film was obtained. The organic EL display obtained was energized to emit light by applying a voltage through a driving circuit. Subsequently, the organic EL display was left to stand for several days in an environment at 85° C. and 85% RH and energized again while observing the formation of non-luminous portions called dark spots. A sample was rated as S if no dark spots were found after it was stored for 7 or more days in the environment at 85° C. and 85% RH, rated as A if a dark spot appeared in 4 to 6 days, rated as B if a dark spot appeared in 2 to 3 days, and rated as C if a dark spot appeared in 1 day.

Example 66

Except for using the heat resistant resin film prepared in Example 41, the same procedure as in Example 65 was carried out to produce and evaluate an organic EL display.

Example 67

Except for using the heat resistant resin film prepared in Example 45, the same procedure as in Example 65 was carried out to produce and evaluate an organic EL display.

Example 68

Except for using the heat resistant resin film prepared in Example 52, the same procedure as in Example 65 was carried out to produce and evaluate an organic EL display.

Example 69

Except for using the heat resistant resin film prepared in Example 60, the same procedure as in Example 65 was carried out to produce and evaluate an organic EL display.

Comparative Example 17

Except for using the heat resistant resin film prepared in Comparative example 9, the same procedure as in Example 65 was carried out to produce and evaluate an organic EL display.

Evaluation results obtained in Examples 65 to 69 and Comparative example 17 are shown in Table 4.

TABLE 4

| Example | Heat resistant resin film | Evaluation for dark spot formation Inorganic film under first film | | | |
|---|---|---|---|---|---|
| | | $Si_3N_4$ | | $SiO_2$ | |
| | | number of days | rating | number of days | rating |
| Example 65 | Example 33 | 7< | S | 5 | A |
| Example 66 | Example 41 | 6 | A | 3 | B |
| Example 67 | Example 45 | 6 | A | 3 | B |
| Example 68 | Example 52 | 4 | A | 5 | A |
| Example 69 | Example 60 | 3 | B | 3 | B |
| Comparative example 17 | Comparative example 9 | 1 | C | 1 | C |

EXPLANATION OF NUMERALS

101: support
102: heat resistant resin film
103: film thickness at peak
200: laminate composed of a glass substrate and a heat resistant resin film formed thereon
201: glass substrate
202: heat resistant resin film
204: "+" mark showing a measuring position
300: laminate composed of a glass substrate and a heat resistant resin film formed thereon
301: glass substrate
302: heat resistant resin film
304: line showing 10 mm inside the edge of the heat resistant resin film

The invention claimed is:

1. A resin composition for a display substrate comprising a heat resistant resin or a precursor thereof and a solvent, the solvent containing, as primary component, an amide compound with a surface tension of 35 mN/m or less at 25° C., wherein the heat resistant resin or precursor thereof contains a repeating unit as represented by chemical formula (3) as primary component and 50 to 95 mol % of the $R^4$ or $R^5$ groups contained in the resin is accounted for by hydrocarbon groups containing 1 to 10 carbon atoms:

[Chemical compound 4]

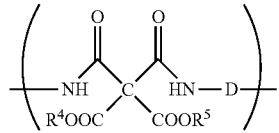

(3)

wherein C in chemical formula (3) denotes a tetravalent tetracarboxylic acid residue containing 2 or more carbon atoms; D denotes a divalent diamine residue containing 2 or more carbon atoms; and $R^4$ and $R^5$ each independently represent a hydrogen atom or a hydrocarbon group having 1 to 10 carbon atoms.

2. A production method for an organic EL display substrate having an inorganic film containing atoms of silicon and one or more additional elements selected from the group consisting of nitrogen, oxygen, and carbon, and a second film, comprising:

forming the second film on a support; and
forming the inorganic film on the second film,
forming a first film in direct contact and on a surface of the inorganic film opposite to a surface on which the second film has been formed,
wherein each of the step for forming the second film and the step for forming the first film comprises at least applying and calcining a resin composition for a display substrate as set forth in claim 1, and
wherein each of the second film and the first film has a thickness in a range of 5 μm or more and 30 μm or less.

3. A production method for an organic EL display substrate as set forth in claim 2, wherein the resin composition for a display substrate used to form the first film is the same as the resin composition for a display substrate used to form the second film.

4. A production method for an organic EL display substrate as set forth in claim 2, wherein the inorganic film contains silicon nitride.

5. A production method for an organic EL display comprising a step for forming an electronic device on the first film of an organic EL display substrate produced by a production method as set forth in claim 2, wherein the electronic device is a thin film transistor.

6. A production method for an organic EL display according to claim 5 further comprising a step of peeling at an interface of the second film and the support, thereby producing a flexible organic EL display.

7. A production method for an organic EL display comprising a step for forming a second film on a support, a step for forming an inorganic film on the second film, a step for forming a first film on the inorganic film, a step for forming an electronic device on the first film, and a step for removing the support, the step for forming the first film and the step for forming the second film each containing at least applying and calcining a resin composition for display substrate as set forth in claim 1, wherein the electronic device is a thin film transistor.

* * * * *